(12) United States Patent
Hashimoto

(10) Patent No.: US 10,090,276 B2
(45) Date of Patent: Oct. 2, 2018

(54) SEMICONDUCTOR PACKAGE TO REDUCE WARPING

(71) Applicant: J-DEVICES CORPORATION, Oita (JP)

(72) Inventor: Kiyoaki Hashimoto, Ishikawa (JP)

(73) Assignee: J-DEVICES CORPORATION, Usuki, Oita (JP)

(*) Notice: Subject to any disclaimer, the term of this patent is extended or adjusted under 35 U.S.C. 154(b) by 0 days.

(21) Appl. No.: 14/944,480

(22) Filed: Nov. 18, 2015

(65) Prior Publication Data

US 2016/0172265 A1    Jun. 16, 2016

(30) Foreign Application Priority Data

Dec. 11, 2014 (JP) ................................. 2014-250866

(51) Int. Cl.
*H01L 25/065* (2006.01)
*H01L 23/538* (2006.01)
(Continued)

(52) U.S. Cl.
CPC .... *H01L 25/0652* (2013.01); *H01L 23/49894* (2013.01); *H01L 23/5383* (2013.01);
(Continued)

(58) Field of Classification Search
CPC ... H01L 23/12; H01L 23/49822; H01L 23/50; H01L 2924/3511; H01L 2225/06562;
(Continued)

(56) References Cited

U.S. PATENT DOCUMENTS

2002/0146859 A1* 10/2002 Akagawa ................ H01L 24/97
438/106
2003/0111722 A1* 6/2003 Nakao ................... H01L 21/563
257/686

(Continued)

FOREIGN PATENT DOCUMENTS

JP   2004-056093 A   2/2004
JP   2006-024842 A   1/2006
(Continued)

OTHER PUBLICATIONS

Japanese Office Action dated Mar. 27, 2018 for corresponding Japanese Application No. 2014-250866, With partial English translation.

*Primary Examiner* — Frederick B Hargrove
(74) *Attorney, Agent, or Firm* — Hauptman Ham, LLP

(57) ABSTRACT

A semiconductor package includes a first semiconductor device provided on a support substrate; a first encapsulation material covering the first semiconductor device; a first line provided on the first encapsulation material, the first line being connected with the first semiconductor device; an intermediate buffer layer covering the first line, and a second encapsulation material provided on the intermediate buffer layer. The first encapsulation material and the second encapsulation material are each formed of an insulating material different from an insulating material used to form the intermediate buffer layer. A second semiconductor device covered with the second encapsulation material may be provided on the intermediate buffer layer.

8 Claims, 17 Drawing Sheets

(51) Int. Cl.
*H01L 23/00* (2006.01)
*H01L 23/498* (2006.01)
*H01L 23/31* (2006.01)

(52) U.S. Cl.
CPC ........ *H01L 23/5389* (2013.01); *H01L 23/562* (2013.01); *H01L 24/19* (2013.01); *H01L 24/20* (2013.01); *H01L 24/24* (2013.01); *H01L 24/82* (2013.01); *H01L 24/97* (2013.01); H01L 23/3128 (2013.01); H01L 23/49816 (2013.01); H01L 2224/04105 (2013.01); H01L 2224/12105 (2013.01); H01L 2224/24145 (2013.01); H01L 2224/24226 (2013.01); H01L 2224/293 (2013.01); H01L 2224/2919 (2013.01); H01L 2224/2929 (2013.01); H01L 2224/32145 (2013.01); H01L 2224/32225 (2013.01); H01L 2224/32245 (2013.01); H01L 2224/73217 (2013.01); H01L 2224/73267 (2013.01); H01L 2224/83191 (2013.01); H01L 2224/83192 (2013.01); H01L 2224/92244 (2013.01); H01L 2224/97 (2013.01); H01L 2924/14 (2013.01); H01L 2924/19041 (2013.01); H01L 2924/19042 (2013.01); H01L 2924/19043 (2013.01); H01L 2924/3025 (2013.01); H01L 2924/3511 (2013.01)

(58) Field of Classification Search
CPC . H01L 2224/04105; H01L 2224/73217; H01L 2224/73267; H01L 2224/92244; H01L 24/20; H01L 24/24; H01L 24/82

See application file for complete search history.

(56) References Cited

U.S. PATENT DOCUMENTS

| | | | |
|---|---|---|---|
| 2006/0022332 A1* | 2/2006 | Koyama | H01L 23/49816 257/723 |
| 2006/0231939 A1* | 10/2006 | Kawabata | H01L 23/5385 257/686 |
| 2012/0153493 A1* | 6/2012 | Lee | H01L 25/16 257/774 |
| 2013/0200523 A1* | 8/2013 | Sawachi | H01L 24/24 257/774 |
| 2015/0028474 A1* | 1/2015 | Jang | H01L 23/3128 257/737 |

FOREIGN PATENT DOCUMENTS

| | | |
|---|---|---|
| JP | 2010-278334 A | 12/2010 |
| JP | 2011-129717 A | 6/2011 |
| JP | 2013-162071 A | 8/2013 |
| JP | 2013-183103 A | 9/2013 |
| JP | 2014-225662 A | 12/2014 |
| WO | 2010/101167 A1 | 9/2010 |

* cited by examiner

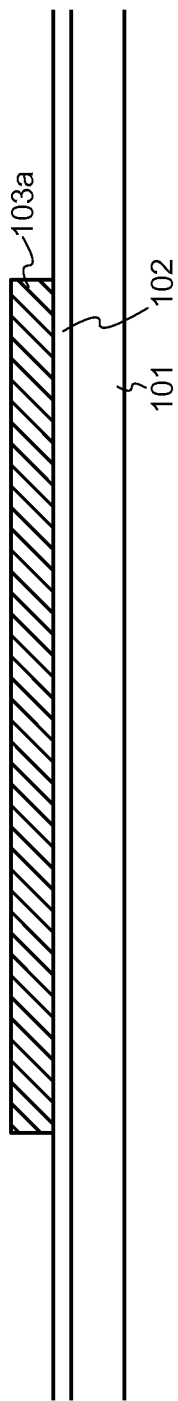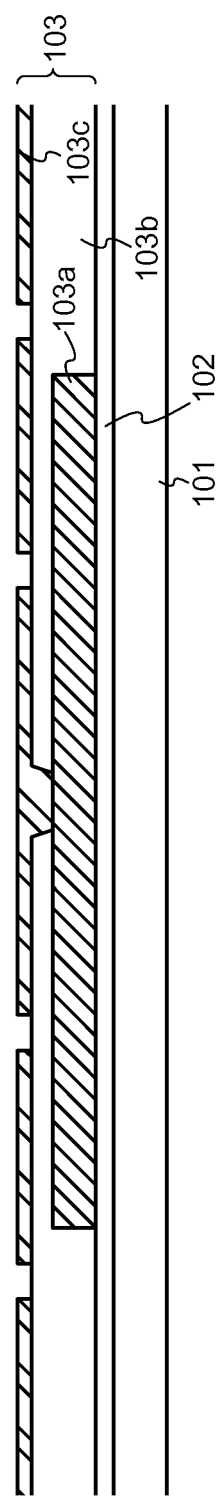

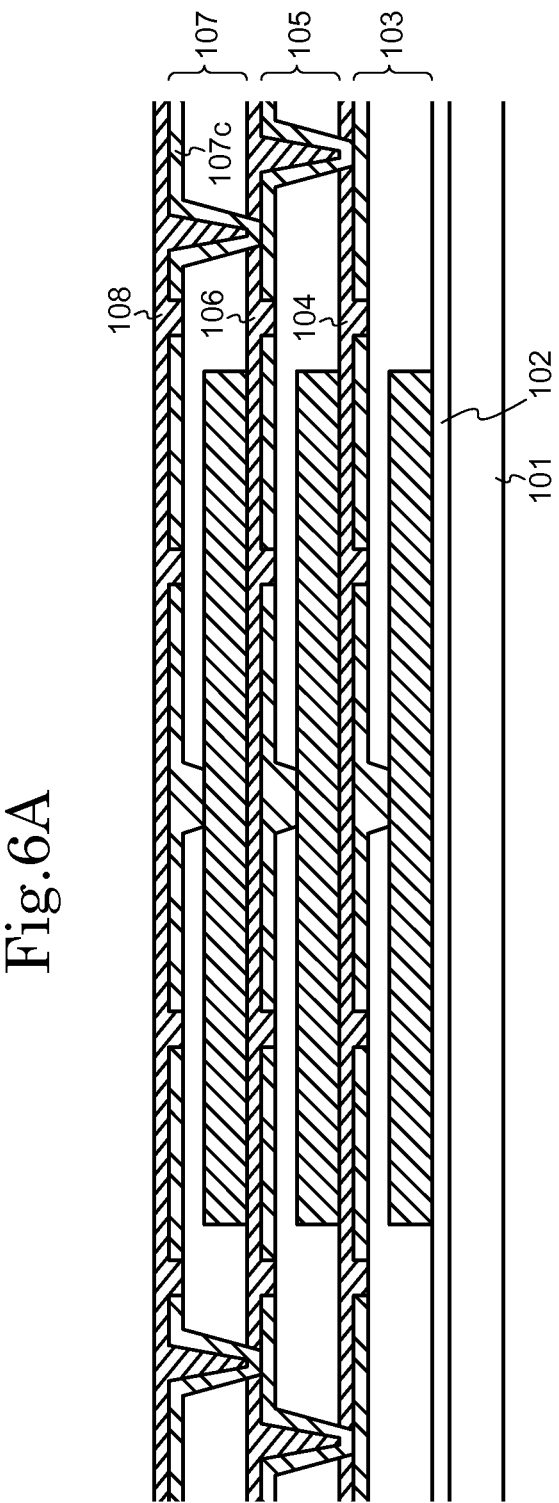

SEMICONDUCTOR PACKAGE TO REDUCE WARPING

CROSS REFERENCE TO RELATED APPLICATIONS

This application is based upon and claims the benefit of priority from the prior Japanese Patent Application No. 2014-250866, filed on Dec. 11, 2014, the entire contents of which are incorporated herein by reference.

FIELD

The present invention relates to a mounting technology for a semiconductor package, and specifically to a technology for relaxing a stress caused during production of a stacked semiconductor package including a plurality of semiconductor devices stacked on a support substrate.

BACKGROUND

Conventionally, a semiconductor package structure including a semiconductor device such as an IC chip or the like mounted on a support substrate is known. Generally in such a semiconductor package structure, a semiconductor device such as an IC chip or the like is bonded to a support substrate via an adhesive material referred to as a "die attach", and the semiconductor device is covered with an encapsulation material (formed of a sealing resin) for protection.

As the support substrate for the semiconductor package, any of various types of substrates including a printed circuit board, a ceramic substrate and the like is used. Especially recently, semiconductor packages using a metal substrate have been actively developed. A semiconductor package including semiconductor devices that are mounted on a metal substrate and connected with each other by lines to form a logical circuit has advantages of being high in electromagnetic shielding properties and thermal characteristics, and is now a target of attention as a highly reliable semiconductor package. Such a semiconductor package also has an advantage of having a high degree of designing freedom.

With a structure including semiconductor devices mounted on a support substrate, a plurality of semiconductor devices may be mounted on a large support substrate to produce a plurality of semiconductor packages in one process. In this case, the plurality of semiconductor packages formed on the support substrate are separated from each other after the production process and are provided as individual semiconductor packages. Such a structure of semiconductor package including semiconductor devices mounted on a support substrate has an advantage of being high in mass productivity.

Such semiconductor packages may be produced by use of a large metal substrate as the support substrate. The large metal substrate needs to have a certain level of rigidity in order to withstand processing. However, such a rigid substrate is not easily corrected if warped during the production process. Therefore, how to prevent the substrate from being warped during the production process is a problem to be solved. From the point of view of reliability of the semiconductor package, how to reduce the internal stress is also a problem to be solved.

Recently, stacked semiconductor packages including a plurality of semiconductor devices stacked on an organic substrate have been developed as described in Japanese Laid-Open Patent Publication No. 2010-278334. Especially in such a stacked semiconductor package, problems may occur during the production process thereof. First, an internal stress is caused when a resin layer used to insulate semiconductor devices from each other is cured, and the internal stress causes the warp, the residual stress declines the long-term reliability, and the layers, which are formed of different materials, are delaminated from each other. Second, a material of the support substrate, a resin material, silicon and a metal material used for lines used for the semiconductor package have coefficients of linear thermal expansion thereof not matched, and this causes the warp.

SUMMARY

A semiconductor package in an embodiment according to the present invention includes a first semiconductor device provided on a support substrate; a first encapsulation material covering the first semiconductor device; a first line provided on the first encapsulation material, the first line being connected with the first semiconductor device; an intermediate buffer layer covering the first line; and a second encapsulation material provided on the intermediate buffer layer. The first encapsulation material and the second encapsulation material are each formed of an insulating material different from an insulating material used to form the intermediate buffer layer.

A method for producing a semiconductor package in an embodiment according to the present invention includes locating a first semiconductor device, covered with a first encapsulation material, on a support substrate; forming a first line, connected with the first semiconductor device, on the first encapsulation material; forming an intermediate buffer layer on the first line; and forming a second encapsulation material on the intermediate buffer layer. The first encapsulation material and the second encapsulation material are each formed of an insulating material different from an insulating material used to form the intermediate buffer layer.

The semiconductor package may further include a second semiconductor device provided on the intermediate buffer layer, the second semiconductor device being covered with the second encapsulation material. A plurality of the second semiconductor device may be located parallel to each other.

The semiconductor package may further include a second line provided on the second encapsulation material, the second line being connected with the second semiconductor device. The semiconductor package may further include a second line connected with the first line.

A semiconductor package in an embodiment according to the present invention includes a plurality of semiconductor devices provided in a stacked manner on a support substrate in a direction vertical to a main surface of the support substrate; a first encapsulation material covering the plurality of semiconductor devices; a first line provided on the first encapsulation material, the first line being connected with any of the plurality of semiconductor devices; an intermediate buffer layer covering the first line; and a second encapsulation material provided on the intermediate buffer layer. The first encapsulation material and the second encapsulation material are each formed of an insulating material different from an insulating material used to form the intermediate buffer layer.

The intermediate buffer layer may have a stack structure including a plurality of layers. The semiconductor package may further include a plurality of semiconductor devices provided in a stacked manner on the intermediate buffer layer in the direction vertical to the main surface of the support substrate. The second encapsulation material may cover the plurality of semiconductor devices provided on the intermediate buffer layer.

The plurality of semiconductor devices may be located such that parts thereof do not overlap each other as seen in a plan view.

The first encapsulation material and the second encapsulation material may be formed of the same insulating material as each other. In this case, the intermediate buffer layer preferably has an elastic modulus lower than that of the first encapsulation material and that of the second encapsulation material in the same temperature condition. The intermediate buffer preferably has a thickness that is $1/10$ to $1/2$ of the thickness of the first encapsulation material.

The semiconductor package may further include an underlying buffer layer provided in contact with the support substrate. The second semiconductor device may be provided on the underlying buffer layer. The underlying buffer layer may have a first opening provided therein; a portion of the first encapsulation material in the first opening may have a second opening provided therein; and the first line may be connected with the support substrate via the second opening.

The intermediate buffer layer is preferably formed of a material having an elastic modulus of 2 GPa or lower at room temperature and an elastic modulus of 1 GPa or lower at a temperature exceeding 100° C.

The intermediate buffer layer preferably flattens a step caused by the first line. The intermediate buffer layer may contain a thermosetting resin material.

According to the present invention, a semiconductor package which has a high reliability and a high degree of designing freedom is provided.

BRIEF EXPLANATION OF DRAWINGS

FIG. 3A shows steps of production of the semiconductor package in embodiment 1 according to the present invention;

FIG. 3B shows steps of production of the semiconductor package in embodiment 1 according to the present invention;

FIG. 6A shows steps of production of the semiconductor package in embodiment 1 according to the present invention;

DESCRIPTION OF EMBODIMENTS

Figure 1:
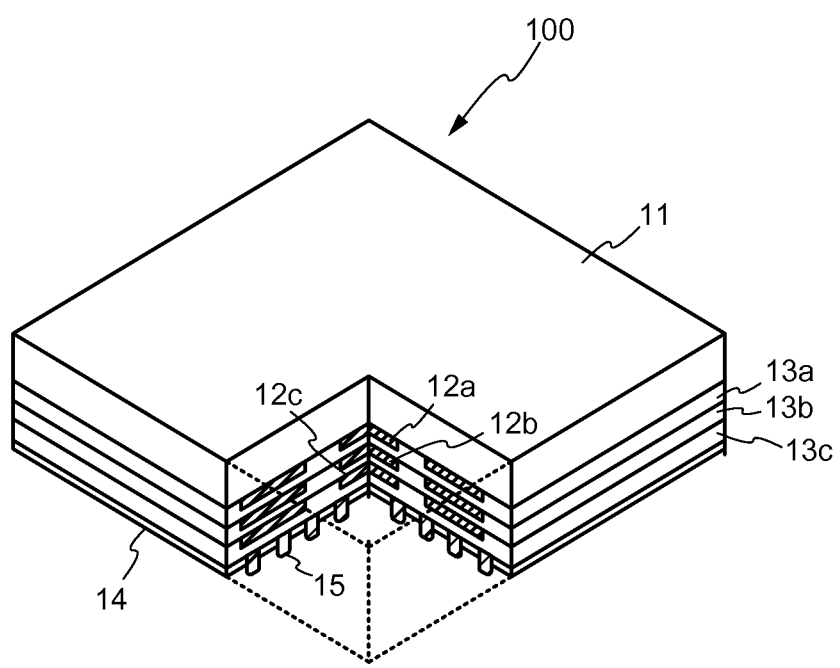
FIG. 1 is an external view of a semiconductor package in embodiment 1 according to the present invention.

The present invention made in light of the above-described problems has an object of providing a semiconductor package which has a high reliability and a high degree of designing freedom.

Hereinafter, semiconductor packages in embodiments according to the present invention will be described in detail with reference to the drawings. The embodiments described below are merely examples, and the present invention is not limited to the following embodiments in any way.

In the drawings referred to in the following embodiments, identical components or components having substantially the same functions will bear identical reference signs or similar signs (with, for example, letters such as a, b or the like after the same reference numerals), and the same descriptions may not be repeated. In the drawings, the ratio of sizes may be different from the actual ratio of sizes, or a part of the components may be omitted, for the convenience of description.

Figure 2:
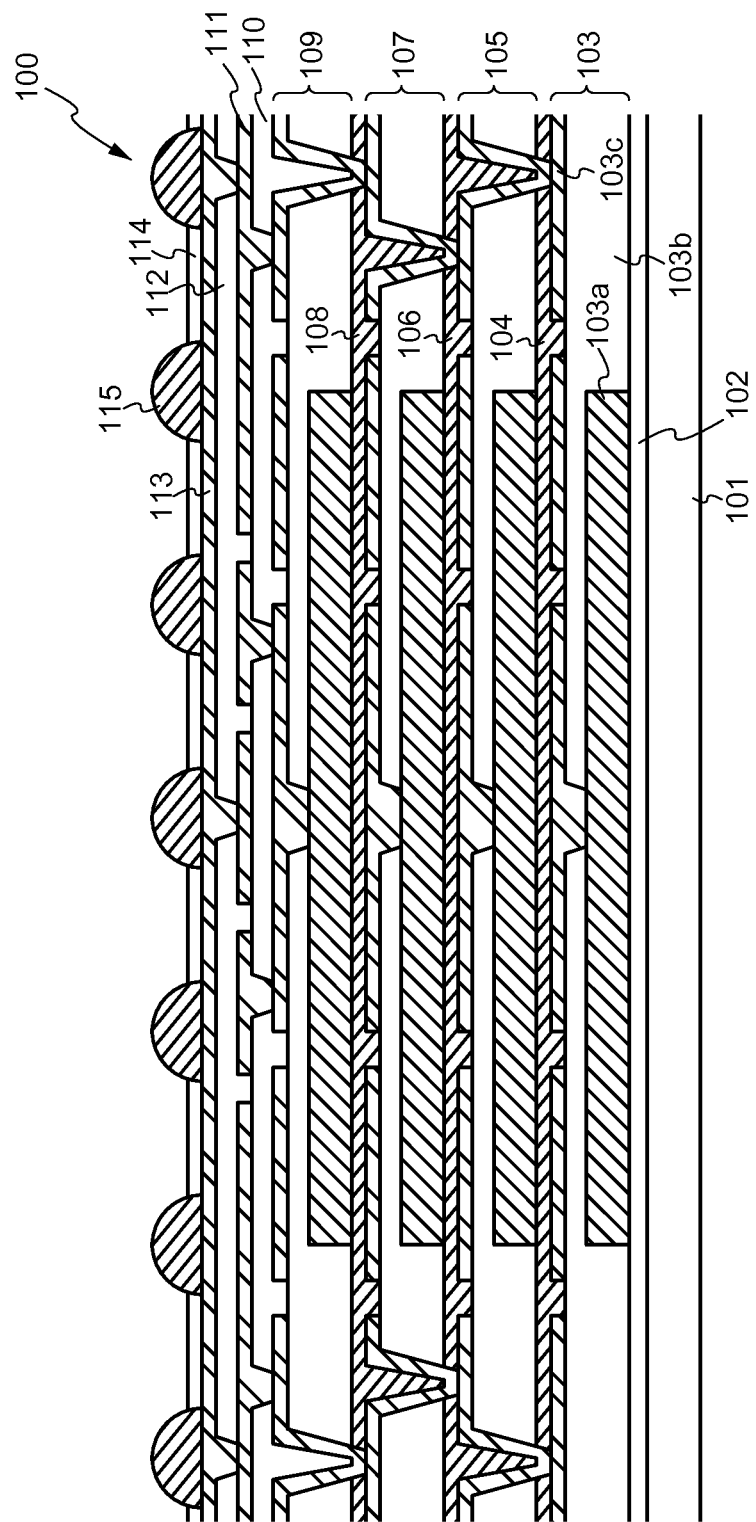
FIG. 2 is a cross-sectional view of the semiconductor package in embodiment 1 according to the present invention.

In this specification, the term "on", "upper" or any other term relating to the upward direction refers to a relative position with respect to a main surface of a support substrate (surface on which a semiconductor device is located), and also a direction of being distanced from the main surface of the support substrate. In FIG. 2 and thereafter, the upward direction as seen from a viewer viewing the sheet of paper is referred to by the term "on", "upper" or the like. When it is expressed that a component is "on" another component, it may be indicated that the first component is located upward with respect to the another component while being in contact therewith, or it may be indicated that the first component is located upward with respect to the another component while being out of contact therewith. A direction of being closer to the main surface of the support substrate is referred to by the term "below", "lower" or the like.

Embodiment 1

External Appearance of the Package

FIG. 1 is an external view of a semiconductor package 100 in embodiment 1 according to the present invention. In FIG. 1, the semiconductor package 100 is shown as being cut away in a lower part of the sheet of paper in order to show an internal structure.

As shown in FIG. 1, a support substrate 11 has semiconductor devices 12a, 12b and 12c located thereon. The semiconductor devices 12a, 12b and 12c are located on the support substrate 11 while being covered with encapsulation materials 13a, 13b and 13c respectively. Namely, the semiconductor package 100 is a structural body in which the semiconductor devices 12a, 12b and 12c and the encapsulation materials 13a, 13b and 13c are stacked alternately on the support substrate 11. On the encapsulation material 13c, a solder resist 14 and external terminals 15 are located. The semiconductor package 100, which is of a stacked type, has such a structure.

As can be seen, the semiconductor package 100 in this embodiment has a structure in which the support substrate 11 is used as a substrate as it is, and the plurality of semiconductor devices 12a, 12b and 12c provided in a stacked manner are covered with the plurality of encapsulation materials 13a, 13b and 13c that are formed of a resin material. Thus, the semiconductor devices 12a, 12b and 12c are protected against external air. The semiconductor package 100 in this embodiment includes an underlying buffer layer between the encapsulation materials. The underlying buffer layer suppresses the internal stress caused at an interface between the encapsulation materials. This will be described in detail with reference to the more specific cross-sectional views.

<Package Structure>

FIG. 2 is a cross-sectional view provided to show a part of the structure of the semiconductor package 100 shown in FIG. 1 in detail. As a support substrate 101, a metal substrate is used in this example. The metal substrate used as the support substrate 101 may be, for example, an iron alloy substrate such as a stainless steel substrate or the like, or a copper alloy substrate. Needless to say, the support substrate 101 is not limited to a metal substrate, and may be a silicon substrate, a glass substrate, a ceramic substrate, an organic material substrate or the like in accordance with the use or the cost.

On the support substrate 101, an insulating layer (in this specification, referred to as an "underlying buffer layer") 102 is provided that alleviates the internal stress between the support substrate 101 and an encapsulation material 103b. The underlying buffer layer 102 is provided in order to alleviate the internal stress caused between the support substrate 101 and the encapsulation material 103b. Namely, the underlying buffer layer 102 has a role of reducing the internal stress (stress caused at an interface between the support substrate 101 and the encapsulation material 103b) that is caused due to a difference in property values between the support substrate 101 and the encapsulation material 103b.

For the above-described reason, the underlying buffer layer 102 is desirably formed of an insulating material having an elastic modulus lower than that of the support substrate 101 and that of the encapsulation material 103b. In the semiconductor package 100 in this embodiment, the underlying buffer layer 102 may be formed of a thermosetting resin or a thermoplastic resin (e.g., epoxy resin) having a thickness of 10 to 200 µm. Alternatively, the underlying buffer layer 102 may be formed of an inorganic material or a metal filler-containing resin material having a high thermal conductivity.

In this embodiment, the underlying buffer layer 102 is provided in contact with the support substrate 101. Alternatively, the underlying buffer layer 102 may be omitted.

On the underlying buffer layer 102, a semiconductor device 103a is provided with an adhesive material (die attach) (not shown) being provided therebetween. The adhesive material may be a known adhesive material that bonds a support substrate and a semiconductor device to each other (in this example, an adhesive material that bonds the underlying buffer layer 102 and a semiconductor device 103a to each other), and may be, for example, a die attach film.

In this embodiment, the semiconductor device 103a is bonded with an adhesive material. Alternatively, the semiconductor device 103a may be provided directly on the underlying buffer layer 102 without the adhesive material. In this case, the underlying buffer layer 102 may be formed of a resin material, and the semiconductor device 103a may be located before the resin material is cured. The resin material may be cured after the semiconductor device 103a is properly located.

The semiconductor device 103a is a semiconductor element such as an IC chip, an LSI chip or the like. The semiconductor device 103a is located on the underlying buffer layer 102 by a known dicing step and a die-bonding step. In the example shown in FIG. 1, one semiconductor device 103a is located on the support substrate 101. In actuality, a larger number of semiconductor devices may be located parallel to each other on the support substrate 101. In this case, the mass productivity of the semiconductor devices is improved. For example, 500 or more semiconductor devices may be located on a large substrate having a size of, for example, 500 mm×400 mm.

The semiconductor device 103a has a top surface and a side surface thereof covered with the encapsulation material 103b and thus is protected against an external environment. The encapsulation material 103b may be formed of an epoxy-based resin or any other known sealing resin.

On the first encapsulation material 103b, a line 103c is provided. In this example, the line 103c is formed of a copper line. Needless to say, the line 103c is not limited to being formed of a copper line, and may be formed of any known material that provides a good electrical connection with the semiconductor device 103a, for example, aluminum, silver or the like. In FIG. 2, one line pattern is represented by the reference sign 103c. Alternatively, more lines are provided in the same layer as is clear from FIG. 2.

In this embodiment, a stack body including the semiconductor device 103a, the encapsulation material 103b and the line 103c described above will be referred to as a stack body 103. Namely, in this specification, an assembly of a semiconductor device, an encapsulation material covering the semiconductor device and a line provided on the encapsulation material will be treated as a unit of "stack body".

On the line 103c (i.e., on the stack body 103), an insulating layer (in this specification, referred to as an "intermediate buffer layer") 104 is provided that alleviates the internal stress between the encapsulation material 103c and another encapsulation material. The intermediate buffer layer 104 is formed of a material that is different from the material of the encapsulation material 103a or a material of an encapsulation material 105b described later. Specifically, the intermediate buffer layer 104 is formed of a material having an elastic modulus lower than that of the encapsulation material 103b and that of the encapsulation material 105b in the same temperature condition. For example, the intermediate buffer layer 104 is preferably formed of an insulating material having an elastic modulus of 2 GPa or lower in a temperature range of room temperature and an elastic modulus of 1 GPa or lower in a temperature range exceeding 100° C. The upper limit is provided for the elastic modulus in each of the temperature ranges because when the elastic modulus exceeds the respective upper limit, the intermediate buffer layer 104 becomes too hard and the function thereof as a stress alleviation layer is deteriorated.

At room temperature, the intermediate buffer layer 104 sufficiently acts as a stress alleviation layer even if being hard to a certain degree (i.e., even if having a high elastic modulus to some extent). Therefore the intermediate buffer layer 104 may have an elastic modulus of 2 GPa or lower. By contrast, in the temperature range exceeding 100° C. (desirably, the temperature range exceeding 150° C.), for example, a temperature at which a thermosetting resin is cured (around 170° C.), the intermediate buffer layer 104 is set to have an elastic modulus of 1 GPa or lower. A reason for this is that if the intermediate buffer layer 104 has an elastic modulus exceeding 1 GPa in such a high temperature range, there is an undesirable possibility that the intermediate buffer layer 104 does not act as the stress alleviation layer.

The intermediate buffer layer 104 has a higher functionality of alleviating the stress as having a lower elastic modulus. However, in the case where the elastic modulus is too low, the fluidity of the intermediate buffer layer 104 becomes too high, and the intermediate buffer layer 104 may possibly not keep the shape thereof as a layer. Therefore, in this embodiment, the intermediate buffer layer 104 has an elastic modulus in such a range that keeps the shape thereof in a temperature range from room temperature to 260° C. (reflow temperature described later), although the lower limit is not specifically provided for the elastic modulus.

In this embodiment, the intermediate buffer layer 104 located on the line 103c preferably has a thickness controlled to be 15 to 20 μm. The purpose of relaxing the stress is fulfilled better as the intermediate buffer layer 104 is thicker. However, a material having a low elastic modulus has a high coefficient of linear thermal expansion (CTE). If the intermediate buffer layer 104, which has a high coefficient of linear thermal expansion, is thick, the reliability of a via (contact hole) that is to be formed later may be adversely influenced. For example, if the intermediate buffer layer 104 is thick, there may be problems that expansion/shrinkage in a vertical direction causes a joining surface at the bottom of the via to be broken or causes the line pattern on the top side or the inner side of the via to be broken.

Therefore, the intermediate buffer layer 104 is preferably as thin as possible in a range in which steps caused by the line 103c are flattened (i.e., compensated for). For example, the thickness of the intermediate buffer layer 104 is preferably 1/10 to 1/2 (more preferably 1/4 to 1/2) of the thickness of the encapsulation material 103b. In the case where the thickness of the intermediate buffer layer 104 is about 1/10 of the thickness of the encapsulation material 103b, the semiconductor package 100 may be reduced in size while the reliability thereof is guaranteed. However, if the intermediate buffer layer 104 is too thin, the stress relaxing effect is relatively declined. In the case where the stress relaxing effect is considered important, the thickness of the intermediate buffer layer 104 is preferably about 1/4 to 1/2 of the thickness of the encapsulation material 103b in order to realize the size reduction of the semiconductor package 100 and the improvement of the reliability with a good balance.

Based on the above, the insulating layer used to form the intermediate buffer layer 104 preferably has a coefficient of linear thermal expansion higher than that of a material of the encapsulation material 105b included in a stack body 105 provided thereon. In this embodiment, the intermediate buffer layer 104 is formed of an insulating layer having a low elastic modulus. Such an insulating layer has a high coefficient of linear thermal expansion (CTE).

The intermediate buffer layer 104 having the above-described property values is desirably formed of a resin material having a sufficient adhesiveness to an epoxy-based, phenol-based or polyimide-based resin material or a metal material. The expression "sufficient adhesiveness" refers to an adhesive force which does not cause delamination in a general reliability test performed on a semiconductor package regarding the temperature, the humidity and the mechanical stress.

The resin material used to form the intermediate buffer layer 104 desirably has a sufficient fluidity before being cured and flattens steps caused by the lines or the like. Especially for a semiconductor package, an insulating layer having a thickness of several tens of micrometers needs to be formed. Therefore, the resin material used to form the intermediate buffer layer 104 is desirably a thermosetting resin material that is cured uniformly in the thickness direction. The intermediate buffer layer 104 may be formed of any resin material which fulfills the above-described property values.

In general, an internal stress caused between encapsulation materials is smaller than an internal stress caused between a metal substrate and an encapsulation material. Therefore, the elastic modulus of the intermediate buffer layer 104 may be higher than that of the underlying buffer layer 102.

On the intermediate buffer layer 104, the stack body 105, an intermediate buffer layer 106, a stack body 107, an intermediate buffer layer 108, and a stack body 109 are sequentially stacked. As can be seen, the semiconductor package 100 in this embodiment includes an intermediate buffer layer for each of the stack bodies to alleviate the internal stress caused between the stack bodies, namely, between the encapsulation materials.

As described later with reference to FIG. 3 through FIG. 8, the stack body 105, the stack body 107 and the stack body 109 respectively include semiconductor devices 105a, 107a and 109a, encapsulation materials 105b, 107b and 109b, and lines 105c, 107c and 109c. In this example, four stages of stack bodies are stacked. There is no limitation on the number of stages of stack bodies, and the number of stages may be larger or smaller than four.

In FIG. 2, the intermediate buffer layer 106 and the intermediate buffer layer 108 may be formed of the same material as that of the intermediate buffer layer 104. The encapsulation material 105b, the encapsulation material 107b and the encapsulation material 109b may be formed of the same material as that of the encapsulation material 103b. Needless to say, these components are not limited to being formed of such a material. The intermediate buffer layers or the encapsulation materials may be formed of materials having different coefficients of linear thermal expansion or different thicknesses.

On the stack body 109, an encapsulation material 110, a line 111, an encapsulation material 112 and a line 113 are provided. In this embodiment, two layers of lines, namely, the line 111 and the line 113, are provided on the stack body 109. The number of the layers of lines may be larger or smaller, and may be appropriately determined.

On the line 113, a solder resist 114 is provided. On the solder resist 114, external terminals (in this embodiment, solder balls) 115 are provided via an opening. The solder resist 114 may be formed of the same material as that of an encapsulation material, for example, the encapsulation material 103b or the like. Alternatively, the solder resist 114 may be formed of a material having a higher function as a protective film because the solder resist 114 is in direct contact with external air. In the case where the external terminals 115 are the solder balls, the external terminals 115 may be formed by a reflow process performed at around 260° C., instead of the solder balls. Needless to say, the external terminals 115 may be pin-shaped or flat electrode terminals. Namely, the semiconductor package 100 in this embodiment may be of any type, for example, a BGA (ball grid array) type, an LGA (land grid array) type, a PGA (pin grid array) type or the like. This is common to the embodiments described later.

<Production Steps>

FIG. 3 through FIG. 8 show steps of production of the semiconductor package 100 in embodiment 1 according to the present invention.

First, as shown in FIG. 3A, the underlying buffer layer 102 acting as a stress alleviation layer is formed on the support substrate 101. In this example, a stainless substrate (SUS substrate), which is an iron alloy, is used as the support substrate 101. The support substrate 101 may be formed of any other material which has a certain degree of rigidity. For example, the support substrate 101 may be a glass substrate, a silicon substrate, a ceramic substrate, or an organic substrate.

The underlying buffer layer 102 is formed of an insulating material having an elastic modulus lower than that of the support substrate 101 and that of the encapsulation material 103b formed later. In the semiconductor package 100 in this embodiment, the underlying buffer layer 102 is formed of a thermosetting resin material having a thickness of 10 to 200 µm.

After the underlying buffer layer 102 is formed, the semiconductor device 103a is bonded thereon. Although not shown in FIG. 3A, the semiconductor device 103a is bonded by use of an adhesive material (die attach). Specifically, the semiconductor device 103a is bonded as follows. First, a plurality of semiconductor devices (semiconductor elements) are produced on a wafer by a known semiconductor process, and are subjected to a back grind step (step of decreasing the thickness of the wafer) in a state where a die attach film is bonded to the semiconductor devices. Then, the plurality of semiconductor devices are separated from each other into individual semiconductor devices by a dicing step, and the individual semiconductor devices separated while having the die attach film bonded thereto are each bonded to the underlying buffer layer 102 as the semiconductor device 103a.

Next, as shown in FIG. 3B, the encapsulation material 103b is formed to cover the semiconductor device 103a. The encapsulation material 103b may be formed of an epoxy-based resin, a phenol-based resin or a polyimide-based resin. The resin may be a thermosetting resin or a photocurable resin. The encapsulation material 103b may be formed by any known application method such as a screen printing method, a spin coating method or the like.

After the encapsulation material 103b is formed, patterning is performed on the encapsulation material 103b by a known photolithography technology or a known laser processing technology to form an opening at a necessary position. Then, the line 103c is formed by a known film formation technology and a known photolithography technology. The opening is formed to connect the line 103a and the semiconductor device 103a with each other.

Thus, as shown in FIG. 3B, the stack body 103 including the semiconductor device 103a, the encapsulation material 103b and the line 103c is provided on the support substrate 101.

Figure 4A:
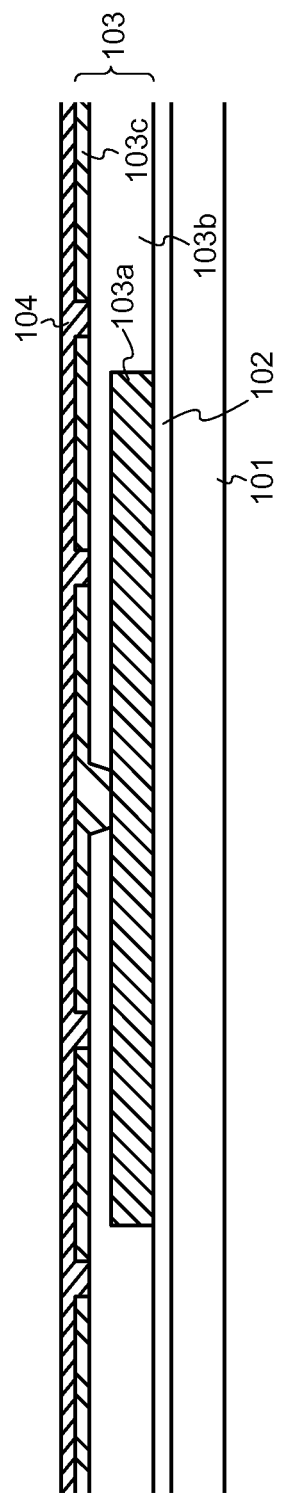
FIG. 4A shows steps of production of the semiconductor package in embodiment 1 according to the present invention.

Next, as shown in FIG. 4A, the intermediate buffer layer 104 is formed to cover the line 103c. As described above, the intermediate buffer layer 104 is formed of an insulating layer having an elastic modulus lower than that of the encapsulation material 103b and that of the encapsulation material 105b that is formed later. In this embodiment, the intermediate buffer layer 104 is formed of a thermosetting resin material having an elastic modulus of 2 GPa or lower in the room temperature range and an elastic modulus of 1 GPa or lower in the temperature range exceeding 100° C.

In this embodiment, such a resin material is applied onto the line 103c by a known application method, and then the resin material is cured by heat to form the intermediate buffer layer 104. A resin material that is sufficiently fluid on the stage of application is used, so that the steps caused by the line 103c may be flattened. Such flattening provides an effect that the adhesive material (die attach) used to form the semiconductor device 105a on the intermediate buffer layer 104 in a later step is allowed to be thinner.

Figure 4B:
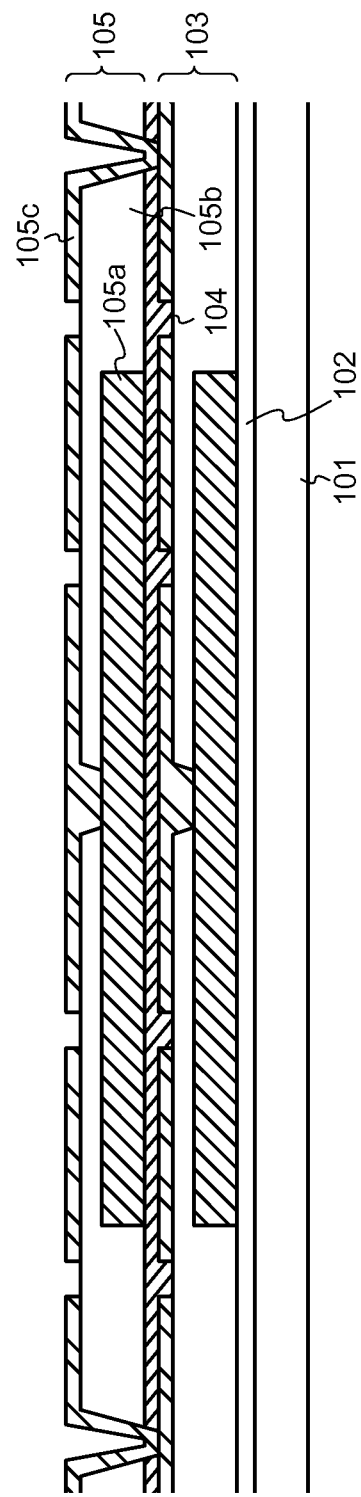
FIG. 4B shows steps of production of the semiconductor package in embodiment 1 according to the present invention.

Next, as shown in FIG. 4B, the semiconductor device 105a, the encapsulation material 105b and the line 105c are formed on the intermediate buffer layer 104. Thus, as shown in FIG. 4B, the stack body 105 including the semiconductor device 105a, the encapsulation material 105b and the line 105c is provided on the support substrate 101. A specific method of forming the stack body 105 is substantially the same as that of the stack body 103, and will not be described in detail.

Figure 5A:
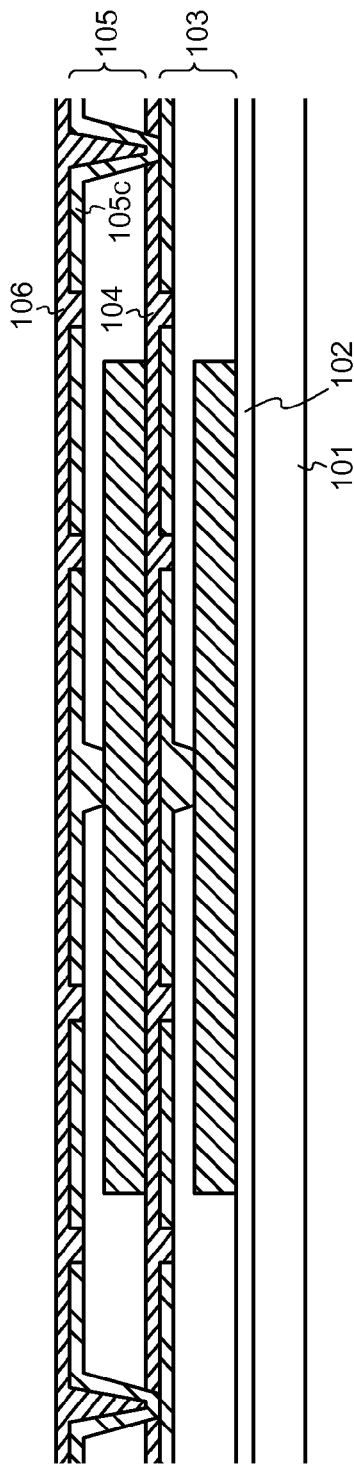
FIG. 5A shows steps of production of the semiconductor package in embodiment 1 according to the present invention.

Then, as shown in FIG. 5A, the intermediate buffer layer 106 is formed to cover the line 105c. Like the intermediate buffer layer 104, the intermediate buffer layer 106 is formed of an insulating layer having an elastic modulus lower than that of the encapsulation material 105b and that of the encapsulation material 107b that is formed later. In this embodiment, the intermediate buffer layer 106 is formed of a thermosetting resin material having an elastic modulus of 2 GPa or lower in the room temperature range and an elastic modulus of 1 GPa or lower in the temperature range exceeding 100° C. In this step also, such a resin material is applied onto the line 105c by a known application method, and then the resin material is cured by heat to form the intermediate buffer layer 106.

Figure 5B:
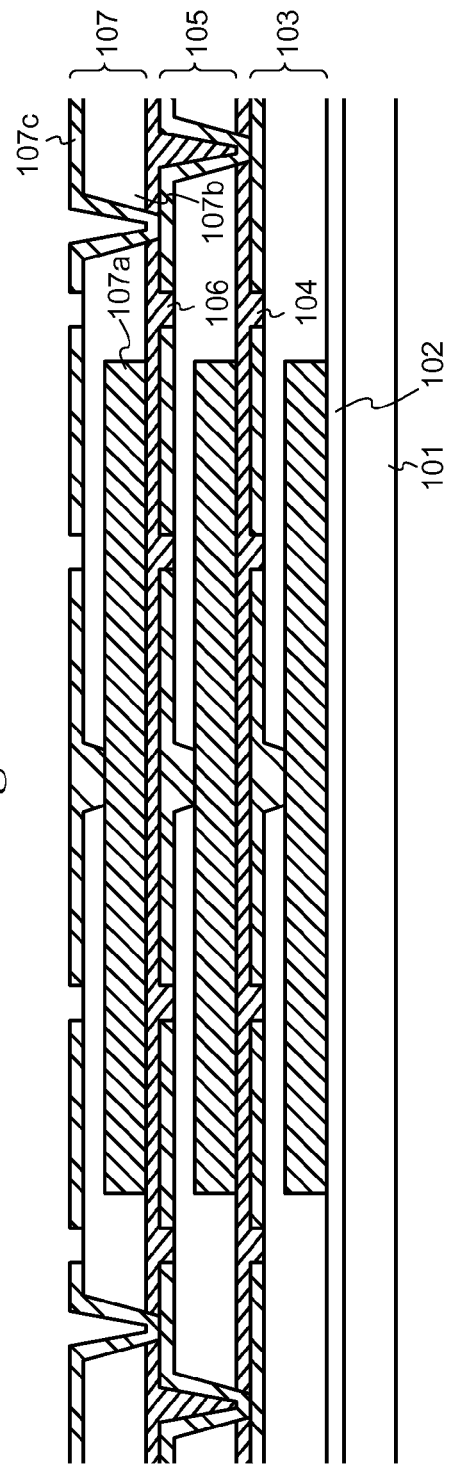
FIG. 5B shows steps of production of the semiconductor package in embodiment 1 according to the present invention.

Next, as shown in FIG. 5B, the semiconductor device 107a, the encapsulation material 107b and the line 107c are formed on the intermediate buffer layer 106. Thus, as shown in FIG. 5B, the stack body 107 including the semiconductor device 107a, the encapsulation material 107b and the line 107c is provided on the support substrate 101. A specific method of forming the stack body 107 is substantially the same as that of the stack body 103, and will not be described in detail.

Then, as shown in FIG. 6A, the intermediate buffer layer 108 is formed to cover the line 107c. Like the intermediate buffer layer 104, the intermediate buffer layer 108 is formed of an insulating layer having an elastic modulus lower than that of the encapsulation material 107b and that of the encapsulation material 109b that is formed later. In this embodiment, the intermediate buffer layer 108 is formed of a thermosetting resin material having an elastic modulus of 2 GPa or lower in the room temperature range and an elastic modulus of 1 GPa or lower in the temperature range exceeding 100° C. In this step also, such a resin material is applied onto the line 107c by a known application method, and then the resin material is cured by heat to form the intermediate buffer layer 108.

Figure 6B:
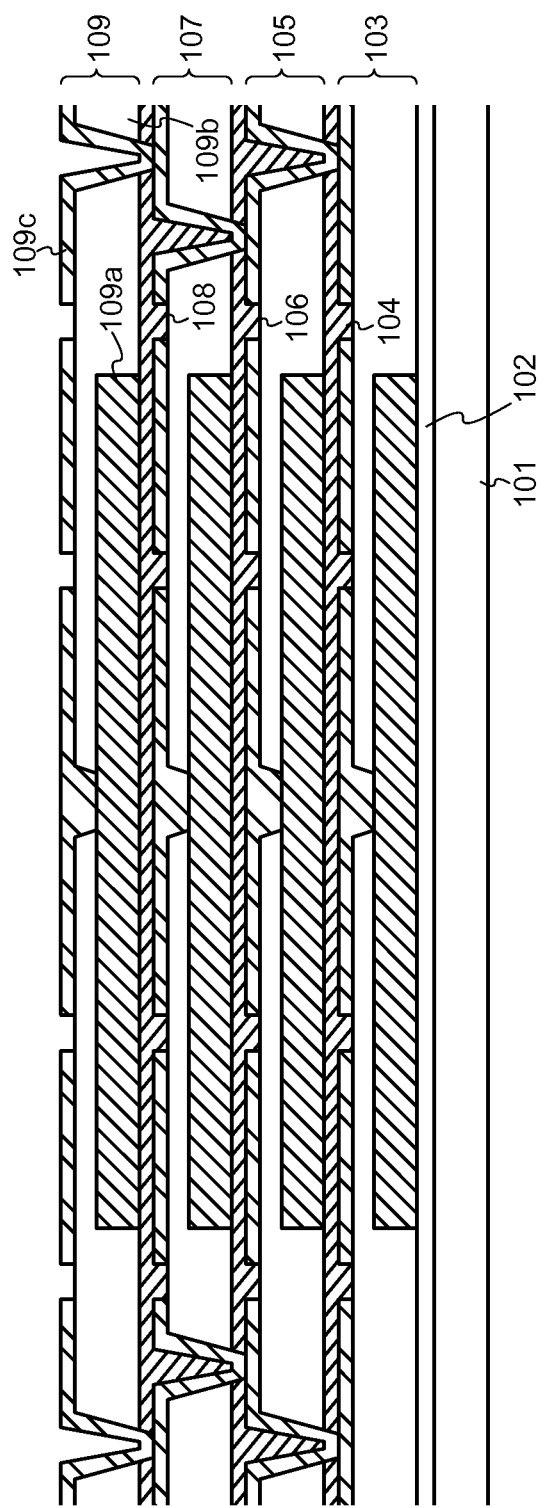
FIG. 6B shows steps of production of the semiconductor package in embodiment 1 according to the present invention.

Next, as shown in FIG. 6B, the semiconductor device 109a, the encapsulation material 109b and the line 109c are formed on the intermediate buffer layer 108. Thus, as shown in FIG. 6B, the stack body 109 including the semiconductor device 109a, the encapsulation material 109b and the line 109c is provided on the support substrate 101. A specific method of forming the stack body 109 is substantially the same as that of the stack body 103, and will not be described in detail.

Figure 7:
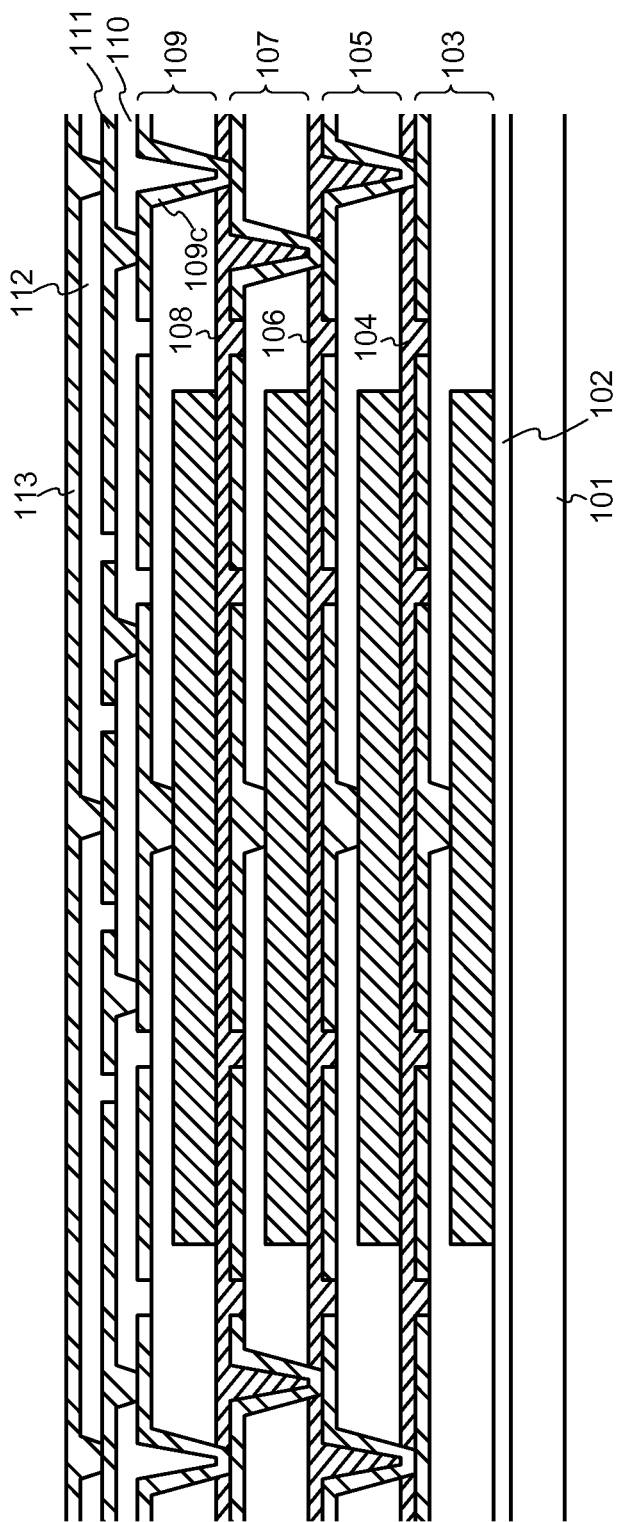
FIG. 7 shows a step of production of the semiconductor package in embodiment 1 according to the present invention.

In this manner, the stack body 103, the stack body 105, the stack body 107 and the stack body 109 are formed on the support substrate 101. Then, as shown in FIG. 7, the encapsulation material 110 is formed on the line 109c. Then, the line 111 is formed by a known film formation technology and a known photolithography technology. In this embodiment, the encapsulation material 112 is formed on the line 111, and the line 113 is formed thereon.

Figure 8:
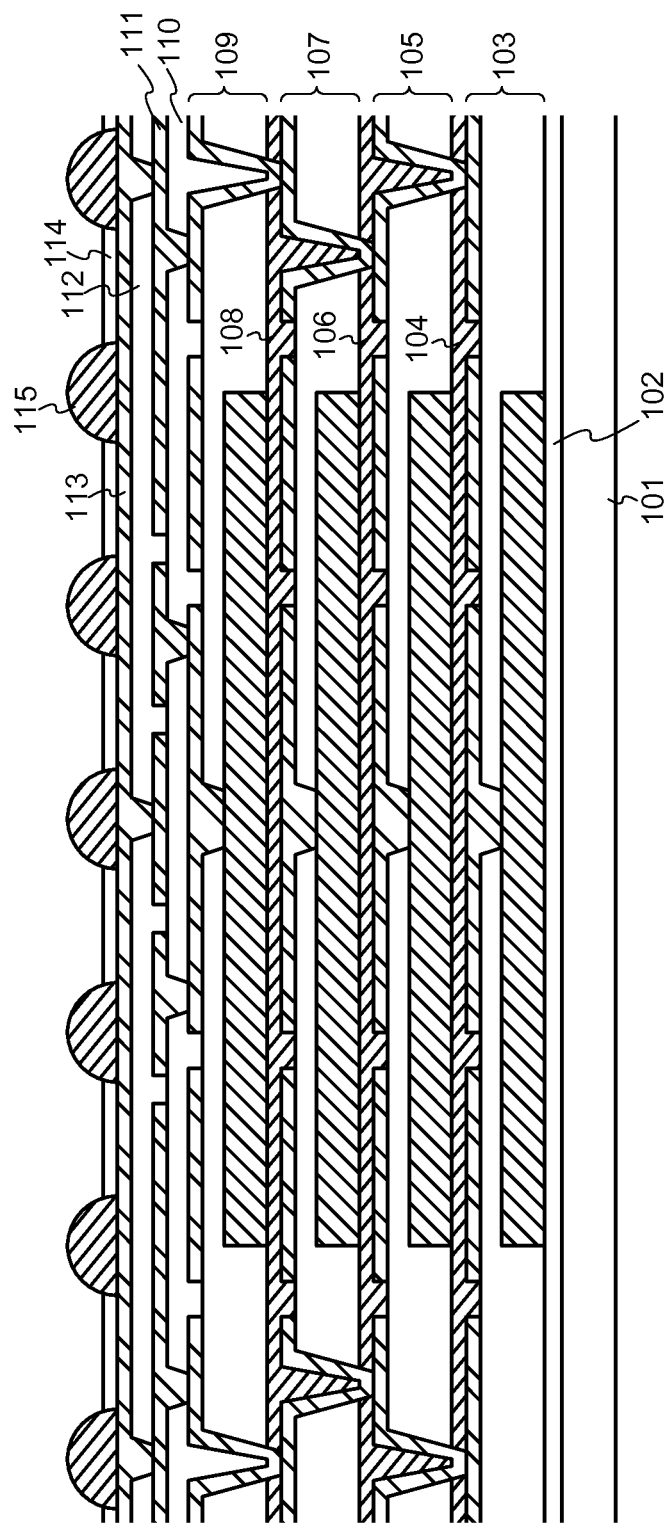
FIG. 8 shows a step of production of the semiconductor package in embodiment 1 according to the present invention.

In a final step, as shown in FIG. 8, the solder resist 114 is formed on the line 113, and the external terminals (in this embodiment, the solder balls) 115 connected with the line 113 are formed. The solder resist 114 and the external terminals 115 may be formed by a known method. In this example, the solder balls are formed by a reflow process performed at 260° C. As described above, the external terminals 115 may be pin-shaped or flat electrode terminals, instead of the solder balls. Namely, the semiconductor package 100 in this embodiment may be of any type, for example, a BGA (ball grid array) type, an LGA (land grid array) type, a PGA (pin grid array) type or the like.

Then, although not shown, the resultant structure with the support substrate 110 is cut by a known singulation process to provide individual semiconductor devices. In this manner, a plurality of the semiconductor packages 100 are produced.

As a result of performing the production steps described above, the semiconductor package 100 according to the present invention shown in FIG. 1 and FIG. 2 is produced. The semiconductor package 100 in this embodiment includes intermediate buffer layers each acting as a stress alleviation layer provided between the encapsulation materials that insulate the semiconductor devices from each other. Such a structure reduces the internal stress caused when the resin material used to form the encapsulation materials is cured. Thus, the problems of warp, decline of the long-term reliability caused by the residual stress, and delamination of layers formed of different materials are prevented to a maximum possible degree. In addition, warp is reduced which is caused by the mismatching of the coefficients of linear thermal expansion of the material of the support substrate, the resin material, silicon and the metal material used for the lines included in the semiconductor package 100.

Therefore, in this embodiment, the semiconductor package 100 with a high reliability is realized without significantly changing the currently used production process. This enlarges the range of selection for the materials and the structures, and the semiconductor package 100 has a higher degree of designing freedom.

Embodiment 2

Figure 9:
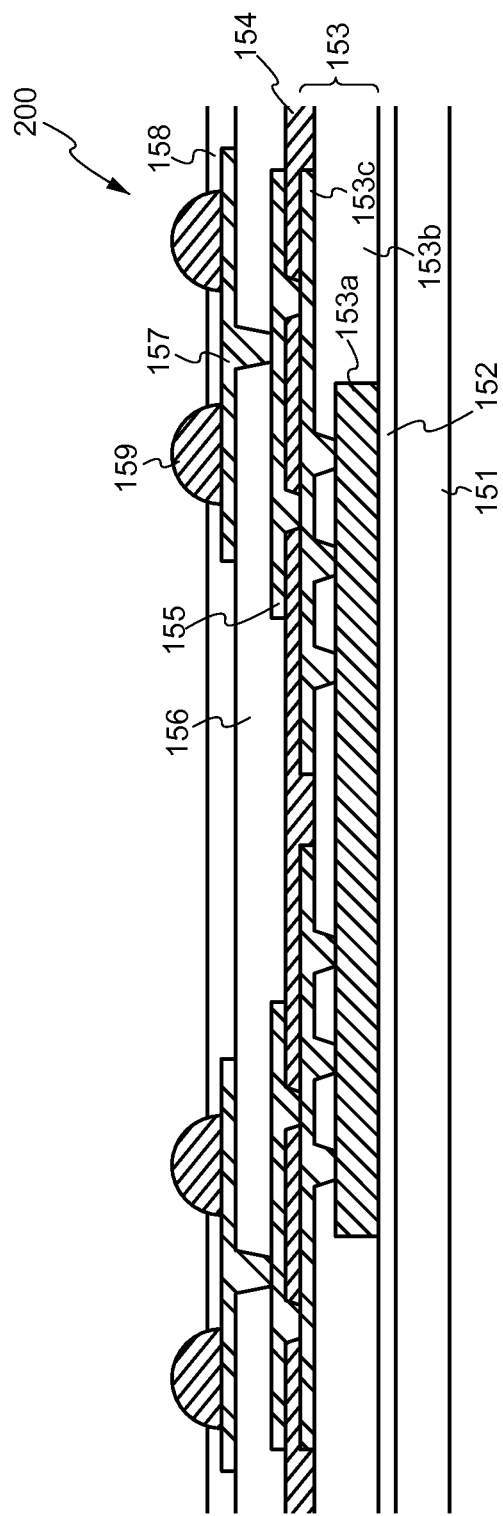
FIG. 9 is a cross-sectional view of a semiconductor package in embodiment 2 according to the present invention.

FIG. 9 is a cross-sectional view showing a part of a structure of a semiconductor package 200 in embodiment 2 according to the present invention. In the semiconductor package 200 in embodiment 2, a line is directly located on an intermediate buffer layer. The details of the layers in this embodiment (e.g., the underlying buffer layer, the intermediate buffer layer and the encapsulation materials) are as described in embodiment 1, and such common structures will not be described.

As shown in FIG. 9, on the support substrate 151, an underlying buffer layer 152 is provided. On the underlying buffer layer 152, a stack body 153 including a semiconductor device 153a, an encapsulation material 153b and a line 153c is located. The line 153c is connected with the semiconductor device 153a via an opening provided in the encapsulation material 153b. In this embodiment, the underlying buffer layer 152 is provided in contact with the support substrate 151. Alternatively, the underlying buffer layer 152 may be omitted.

On the stack body 153, an intermediate buffer layer 154 is provided as a stress alleviation layer. In this embodiment, a plurality of openings are formed in the intermediate buffer layer 154 by a known photolithography technology or a known laser processing technology. On the intermediate buffer layer 154, a line 155 is provided and connected with the line 153c via the openings. In a space on the intermediate buffer layer 154 where the line 155 is not located, another semiconductor device or a passive element such as a resistor, an inductor, a capacitor or the like may be provided.

On the line 155, an encapsulation material 156 is provided. In this embodiment, the presence of the intermediate buffer layer 154 prevents the encapsulation material 153b and the encapsulation material 156 from contacting directly each other, and thus the internal stress caused at an interface between the encapsulation material 153b and the encapsulation material 156 is reduced. The encapsulation material 156 has an opening. A line 157 provided on the encapsulation material 156 is connected with the line 155 via the opening.

On the line 157, a solder resist 158 and external terminals 159 are provided. In this embodiment, the line 157 is the uppermost line. Alternatively, more lines may be provided.

In the semiconductor package 200 in embodiment 2 described above, the second line 155 is provided on the intermediate buffer layer 154. In this manner, the line 155 is provided between the intermediate buffer layer 154 and the encapsulation material 156, so that the semiconductor package 200 has a higher degree of integration in addition to the effect described in embodiment 1.

Embodiment 3

Figure 10:
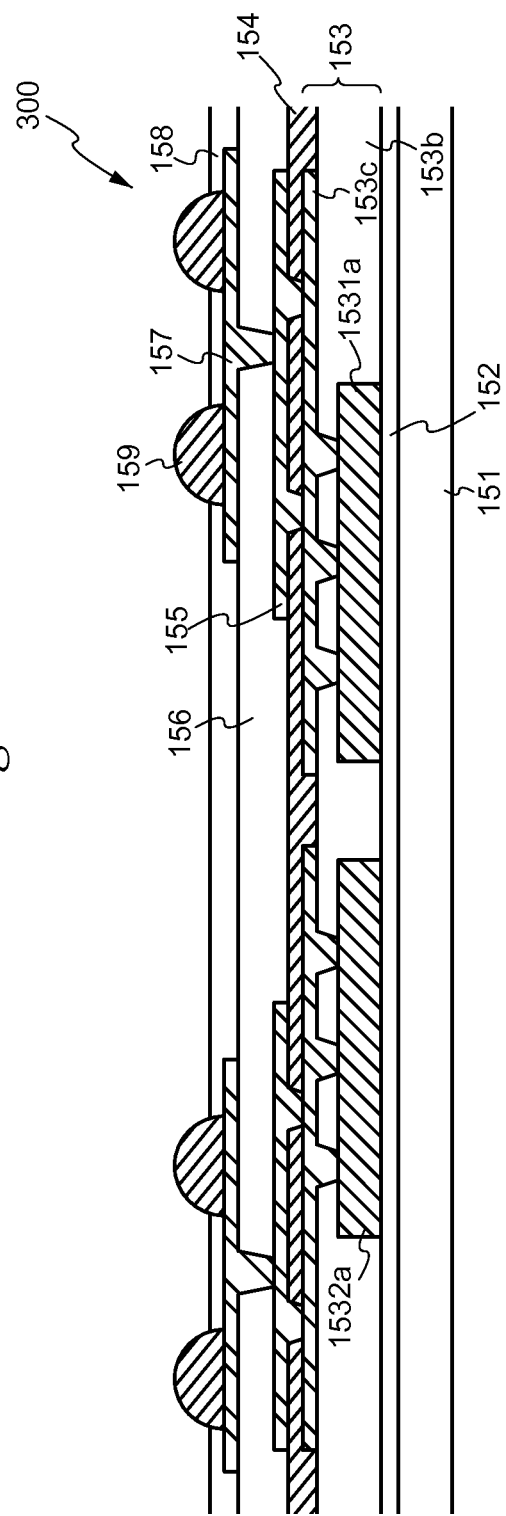
FIG. 10 is a cross-sectional view of a semiconductor package in embodiment 3 according to the present invention.

FIG. 10 is a cross-sectional view showing a part of a structure of a semiconductor package 300 in embodiment 3 according to the present invention. In the semiconductor package 300 in embodiment 3, unlike in the semiconductor package 200 in embodiment 2, a plurality of semiconductor devices are located parallel to each other on the underlying buffer layer 152. The details of the layers in this embodiment (e.g., the underlying buffer layer, the intermediate buffer layer and the encapsulation materials) are as described in embodiment 1, and such common structures will not be described.

As shown in FIG. 10, on the support substrate 151, the underlying buffer layer 152 is provided. On the underlying buffer layer 152, a semiconductor device 1531a and a semiconductor device 1532a are located parallel to each other. In this embodiment, two semiconductor devices are located. Alternatively, a larger number of semiconductor devices may be located. In this embodiment, the underlying buffer layer 152 is provided in contact with the support substrate 151. Alternatively, the underlying buffer layer 152 may be omitted.

The stack body 153 includes the semiconductor device 1531a, the semiconductor device 1532a, the encapsulation material 153b and the line 153c. The line 153c is connected with the semiconductor device 1531a and the semiconductor device 1532a via an opening provided in the encapsulation material 153b. The line 153c may be provided to electrically connect the semiconductor device 1531a and the semiconductor device 1532a to each other.

On the stack body 153, the intermediate buffer layer 154 is provided as a stress alleviation layer. In this embodiment, a plurality of openings are formed in the intermediate buffer layer 154 by a known photolithography technology or a known laser processing technology. On the intermediate buffer layer 154, the line 155 is provided and connected with the line 153c via the openings. In a space on the intermediate buffer layer 154 where the line 155 is not located, another semiconductor device or a passive element such as a resistor, an inductor, a capacitor or the like may be provided.

On the line 155, the encapsulation material 156 is provided. In this embodiment also, the presence of the intermediate buffer layer 154 prevents the encapsulation material 153b and the encapsulation material 156 from contacting directly each other, and thus the internal stress caused at an interface between the encapsulation material 153b and the encapsulation material 156 is reduced. The encapsulation material 156 has an opening. The line 157 provided on the encapsulation material 156 is connected with the line 155 via the opening.

On the line 157, the solder resist 158 and the external terminals 159 are provided. In this embodiment, the line 157 is the uppermost line. Alternatively, more lines may be provided.

In the semiconductor package 300 in embodiment 3 described above, the plurality of semiconductor devices 1531a and 1532a are located parallel to each other on the underlying buffer layer 152. Thus, the integration density of the semiconductor devices on the underlying buffer layer 152 is increased, so that the semiconductor package 300 has a higher degree of integration in addition to the effect described in embodiments 1 and 2.

Embodiment 4

Figure 11:
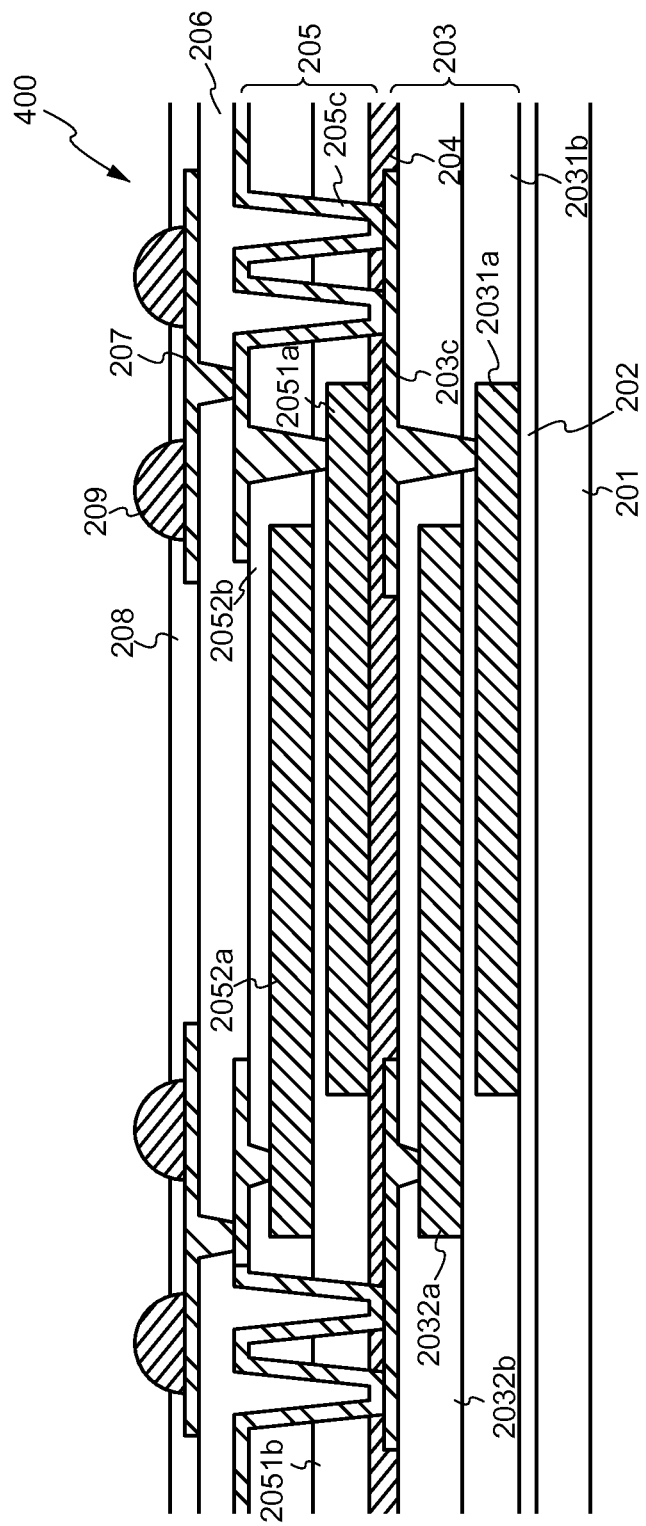
FIG. 11 is a cross-sectional view of a semiconductor package in embodiment 4 according to the present invention.

FIG. 11 is a cross-sectional view showing a part of a structure of a semiconductor package 400 in embodiment 4 according to the present invention. In the semiconductor package 400 in embodiment 4, an intermediate layer is provided for each of stack bodies each including a plurality of semiconductor devices provided in a stacked manner. The details of the layers in this embodiment (e.g., the underlying buffer layer, the intermediate buffer layer and the encapsulation materials) are as described in embodiment 1, and such common structures will not be described.

As shown in FIG. 11, on a support substrate 201, an underlying buffer layer 202 is provided. On the underlying buffer layer 202, a semiconductor device 2031a and a semiconductor device 2032a are stacked in a direction vertical to a main surface of the support substrate 201. In this embodiment, the underlying buffer layer 202 is provided in contact with the support substrate 201. Alternatively, the underlying buffer layer 202 may be omitted.

The semiconductor device 2031a and the semiconductor device 2032a are located such that parts thereof do not overlap each other as seen in a plan view (in the case where the semiconductor package is seen in the direction vertical to the main surface of the support substrate 201). In the case where the semiconductor devices are located to be offset in this manner, a terminal of each of the semiconductor devices is exposed. Thus, each of the semiconductor devices is electrically connectable with another element. With such a structure, in the case where the semiconductor devices adjacent to each other are of the same size, the semiconductor devices may be located to be offset. In the case where the semiconductor devices adjacent to each other are of different sizes, the smaller semiconductor device may be located above the larger semiconductor device such that a terminal of the larger semiconductor device is exposed.

The semiconductor devices 2031a and 2032a are respectively covered with encapsulation materials 2031b and 2032b. As can be seen, in the semiconductor package 400 in this embodiment, a stack body 203 includes the plurality of semiconductor devices 2031a and 2032a stacked in the direction vertical to the main surface of the support substrate 201, the plurality of encapsulation materials 2031b and 2032b, and a line 203c.

In this embodiment, after one semiconductor device is located, the one semiconductor device is covered with the encapsulation material, and then the next semiconductor device is stacked. Alternatively, the plurality of semiconductor devices may be stacked and then covered with the encapsulation materials at the same time. This may be performed as follows. A highly fluid resin material is applied onto the stack body including the plurality of semiconductor devices stacked in a plurality of stages, and then the resin material is cured to form the encapsulation materials. This is applicable to stack bodies described later.

On the stack body 203, an intermediate buffer layer 204 is provided as a stress alleviation layer. The intermediate buffer layer 204 preferably has a thickness that is $\frac{1}{10}$ to $\frac{1}{2}$ (more preferably, $\frac{1}{4}$ to $\frac{1}{2}$) of the total thickness of the encapsulation materials 2031b and 2032b. In this embodiment, one stack body includes two semiconductor devices stacked in the vertical direction, and therefore, an intermediate buffer layer is located on two encapsulation materials stacked provided in a stacked manner. For this reason, in order to alleviate the internal stress caused by the stack of the two encapsulation materials, it is effective that the intermediate buffer layer is thicker than an intermediate buffer layer provided on one encapsulation material. However, if the intermediate buffer layer is too thick, the reliability of the via may possibly be spoiled as described above. Therefore, the thickness of the intermediate buffer layer is preferably in the above-described range of $\frac{1}{10}$ to $\frac{1}{2}$ (more preferably, $\frac{1}{4}$ to $\frac{1}{2}$) of the total thickness of the two encapsulation materials.

On the intermediate buffer layer 204, a stack body 205 including a plurality of semiconductor devices 2051a and 2052a, a plurality of encapsulation materials 2051b and 2052b, and a line 205c is provided. In this embodiment also, the presence of the intermediate buffer layer 204 prevents the encapsulation material 2032b and the encapsulation material 2051b from contacting directly each other, and thus the internal stress caused at an interface between the encapsulation materials 2032b and 2051b is reduced.

The encapsulation materials 2051b and 2052b each have an opening. The line 205c provided on the encapsulation material 2052b is connected with the line 203c via the opening. Thus, the semiconductor device 2031a and the semiconductor device 2051a are electrically connected with each other, and the semiconductor device 2032a and the semiconductor device 2052a are electrically connected with each other. Needless to say, the semiconductor package 400 is not limited to having such a structure, and the semiconductor device 2031a and the semiconductor device 2052a (or the semiconductor device 2032a and the semiconductor device 2051a) may be electrically connected with each other.

On the stack body 205, an encapsulation material 206 and a line 207 are provided, and a solder resist 208 and external terminals 209 are provided thereon. In this embodiment, the line 207 is the uppermost line. Alternatively, more lines may be provided.

The semiconductor package 400 in embodiment 4 described above includes a plurality of stack bodies including a plurality of semiconductor devices provided in a stacked manner in a direction vertical to the main surface of the support substrate, encapsulation materials covering the plurality of semiconductor devices, and lines respectively provided on the encapsulation materials and each connected with any of the plurality of semiconductor devices. An intermediate buffer layer is provided for each of the stack bodies. Namely, an intermediate buffer layer is provided between the stack bodies.

In this structure, an internal stress is caused also between, for example, the encapsulation material 2031b and the encapsulation material 2032b or between the encapsulation material 2051b and the encapsulation material 2052b. From the point of view of relaxing the stress, an intermediate buffer layer may also be provided between these encapsulation materials.

However, in such a case, the semiconductor package 400 becomes thicker by the thickness of such an additional intermediate buffer layer. Therefore, it is preferable that, as in this embodiment, an intermediate buffer layer is provided on at least a layer including a line (i.e., between stack bodies). In this structure, the thickness of the semiconductor package 400 is substantially increased merely by the thickness of the intermediate layer located on the line. Thus, steps caused by the line are flattened while the stress is alleviated. Therefore, the semiconductor package 400 has a smaller size and has a higher degree of integration in addition to the effect described in embodiment 1.

Embodiment 5

Figure 12:
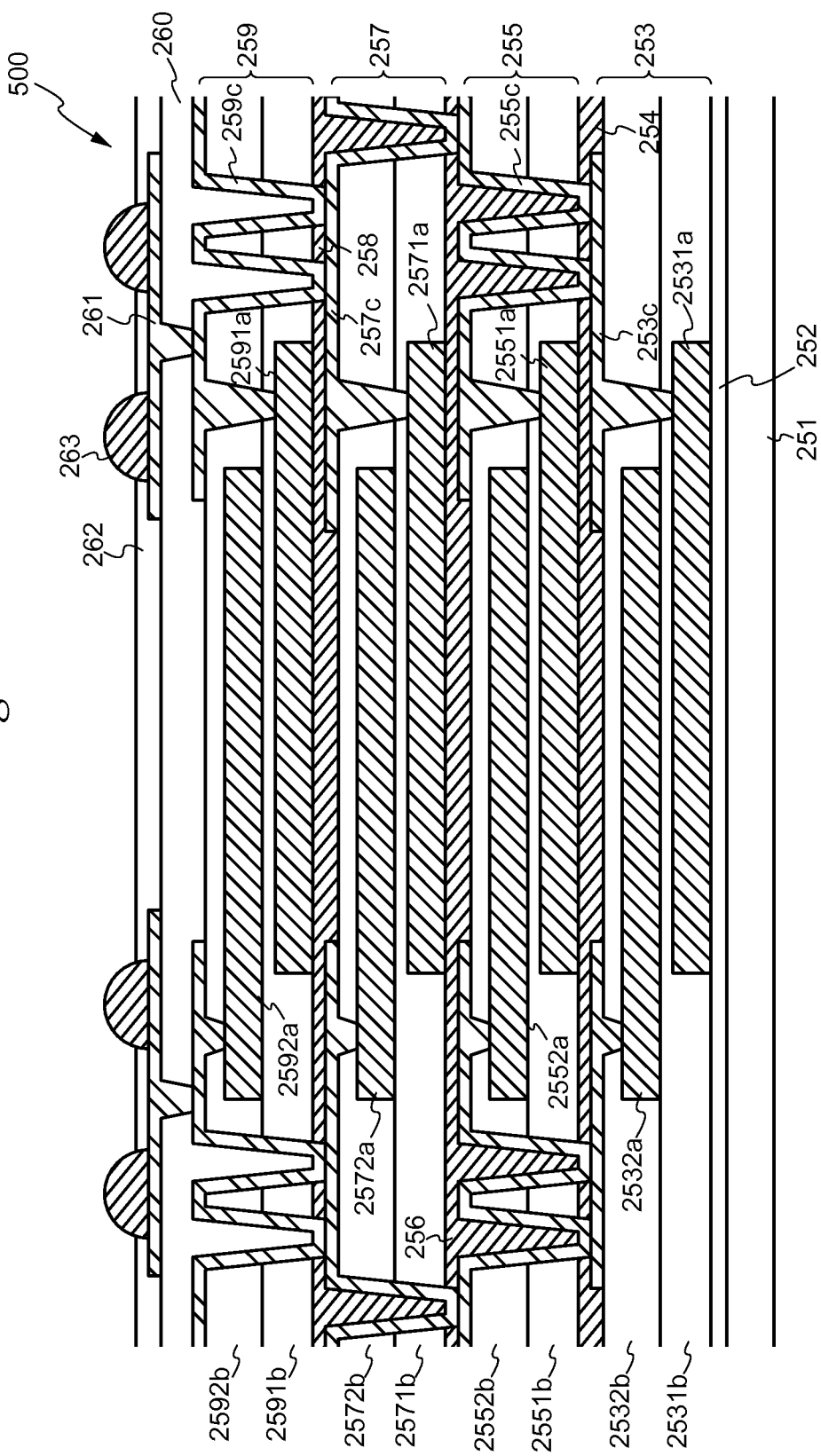
FIG. 12 is a cross-sectional view of a semiconductor package in embodiment 5 according to the present invention.

FIG. 12 is a cross-sectional view showing a part of a structure of a semiconductor package 500 in embodiment 5 according to the present invention. In the semiconductor package 500 in embodiment 5, a plurality of stack bodies, each including a plurality of semiconductor devices provided in a stacked manner, are stacked, and an intermediate buffer layer is provided for each of the stack bodies. The details of the layers in this embodiment (e.g., the underlying buffer layer, the intermediate buffer layers and the encapsulation materials) are as described in embodiment 1, and such common structures will not be described.

As shown in FIG. 12, on a support substrate 251, an underlying buffer layer 252 is provided. On the underlying buffer layer 252, a semiconductor device 2531a and a semiconductor device 2532a are stacked in a direction vertical to a main surface of the support substrate 251. In this embodiment, the underlying buffer layer 252 is provided in contact with the support substrate 251. Alternatively, the underlying buffer layer 252 may be omitted.

The semiconductor device 2531a and the semiconductor device 2532a are located such that parts thereof do not overlap each other as seen in a plan view (in the case where the semiconductor package is seen in the direction vertical to the main surface of the support substrate 251). In the case where the semiconductor devices are located to be offset in this manner, a terminal of each of the semiconductor devices is exposed. Thus, each of the semiconductor devices is electrically connectable with another element. With such a structure, in the case where the semiconductor devices adjacent to each other are of the same size, the semiconductor devices may be located to be offset. In the case where the semiconductor devices adjacent to each other are of different sizes, the smaller semiconductor device may be located above the larger semiconductor device such that a terminal of the larger semiconductor device is exposed.

The semiconductor devices 2531a and 2532a are respectively covered with encapsulation materials 2531b and 2532b. As can be seen, in the semiconductor package 500 in this embodiment, a stack body 253 includes the plurality of semiconductor devices 2531a and 2532a stacked in the direction vertical to the main surface of the support substrate 251, the plurality of encapsulation materials 2531b and 2532b, and a line 253c.

In this embodiment, after one semiconductor device is located, the one semiconductor device is covered with the encapsulation material, and then the next semiconductor device is stacked. Alternatively, the plurality of semiconductor devices may be stacked and then covered with the encapsulation materials at the same time. This may be performed as follows. A highly fluid resin material is applied onto the stack body including the plurality of semiconductor devices stacked in a plurality of stages, and then the resin material is cured to form the encapsulation materials. This is applicable to stack bodies described later.

On the stack body 253, an intermediate buffer layer 254 is provided as a stress alleviation layer. The intermediate buffer layer 254 preferably has a thickness that is $\frac{1}{10}$ to $\frac{1}{2}$ (more preferably, $\frac{1}{4}$ to $\frac{1}{2}$) of the total thickness of the encapsulation materials 2531b and 2532b. This is applicable to intermediate buffer layers described later.

On the intermediate buffer layer 254, a stack body 255 including a plurality of semiconductor devices 2551a and 2552a, a plurality of encapsulation materials 2551b and 2552b, and a line 255c is provided. In this embodiment also, the presence of the intermediate buffer layer 254 prevents the encapsulation material 2532b and the encapsulation material 2551b from contacting directly each other, and thus the internal stress caused at an interface between the encapsulation materials 2532b and 2551b is reduced.

The encapsulation materials 2551b and 2552b each have an opening. The line 255c provided on the encapsulation material 2552b is connected with the line 253c via the opening. Thus, the semiconductor device 2531a and the semiconductor device 2551a are electrically connected with each other, and the semiconductor device 2532a and the semiconductor device 2552a are electrically connected with each other. Needless to say, the semiconductor package 500 is not limited to having such a structure, and the semiconductor device 2531a and the semiconductor device 2552a (or the semiconductor device 2532a and the semiconductor device 2551a) may be electrically connected with each other.

On the line 255c, a second intermediate layer 256 is provided. The second intermediate layer 256 flattens steps caused by the line 255c and also steps caused by the openings provided in the encapsulation materials 2551b and 2552b. In this manner, even in the case where a line connecting the stack bodies to each other is provided, such an intermediate buffer layer has a stress relaxing function and a flattening function. Therefore, the semiconductor package 500 has a suppressed thickness.

On the intermediate layer 256, a stack body 257 including a plurality of semiconductor devices 2571a and 2572a, a plurality of encapsulation materials 2571b and 2572b, and a line 257c is provided. In this case also, the presence of the intermediate buffer layer 256 prevents the encapsulation material 2552b and the encapsulation material 2571b from contacting directly each other, and thus the internal stress caused at an interface between the encapsulation materials 2552b and 2571b is reduced.

On the line 257c, a third intermediate layer 258 is provided. The third intermediate layer 258 also flattens steps caused by the line 257c and also steps caused by the openings provided in the encapsulation materials 2571b and 2572b.

On the intermediate layer 258, a stack body 259 including a plurality of semiconductor devices 2591a and 2592a, a plurality of encapsulation materials 2591b and 2592b, and a line 259c is provided. In this case also, the presence of the intermediate buffer layer 258 prevents the encapsulation material 2572b and the encapsulation material 2591b from contacting directly each other, and thus the internal stress caused at an interface between the encapsulation materials 2572b and 2591b is reduced.

On the stack body 259, an encapsulation material 260 and a line 261 are provided, and a solder resist 262 and external terminals 263 are provided thereon. In this embodiment, the line 261 is the uppermost line. Alternatively, more lines may be provided.

The semiconductor package 500 in embodiment 5 described above includes a plurality of stack bodies including a plurality of semiconductor devices provided in a stacked manner in a direction vertical to the main surface of the support substrate, encapsulation materials covering the plurality of semiconductor devices, and lines respectively provided on the encapsulation materials and each connected with any of the plurality of semiconductor devices. An intermediate buffer layer is provided for each of the stack bodies. Namely, an intermediate buffer layer is provided between the stack bodies.

In this structure, as described in embodiment 4, an intermediate buffer layer may also be provided between the encapsulation materials included in each of the stack bodies (e.g., the encapsulation materials 2531b and 2532b). However, from the point of view of decreasing the size of the semiconductor package 500, it is more preferable that an intermediate buffer layer is provided for each of the stack bodies.

In the case where the stack bodies are stacked in three or more stages as in the semiconductor package 500, a plurality of intermediate buffer layers are provided. An intermediate buffer layer closer to the support substrate 251 may be have a lower elastic modulus. In such a structure, the internal stress is accumulated as the stack bodies are stacked from a position close to the support substrate toward a position far from the support substrate. Therefore, the internal stress (accumulated stress) tends to be larger in a lower layer than in an upper layer. For this reason, it is preferable that, for example, the elastic modulus of the underlying buffer layer 252 is lower than the elastic modulus of any of the intermediate buffer layers 254, 256 and 258. In addition, the elastic modulus may be set to be gradually decreased from the uppermost intermediate buffer layer to the lowermost intermediate buffer layer, so that the intermediate buffer layer 258 has the highest elastic modulus and the intermediate buffer layer 254 has the lowest elastic modulus among the intermediate buffer layers.

The semiconductor package 500 in this embodiment described above has a smaller size and has a higher degree of integration in addition to the effect described in embodiment 1.

Embodiment 6

Figure 13:
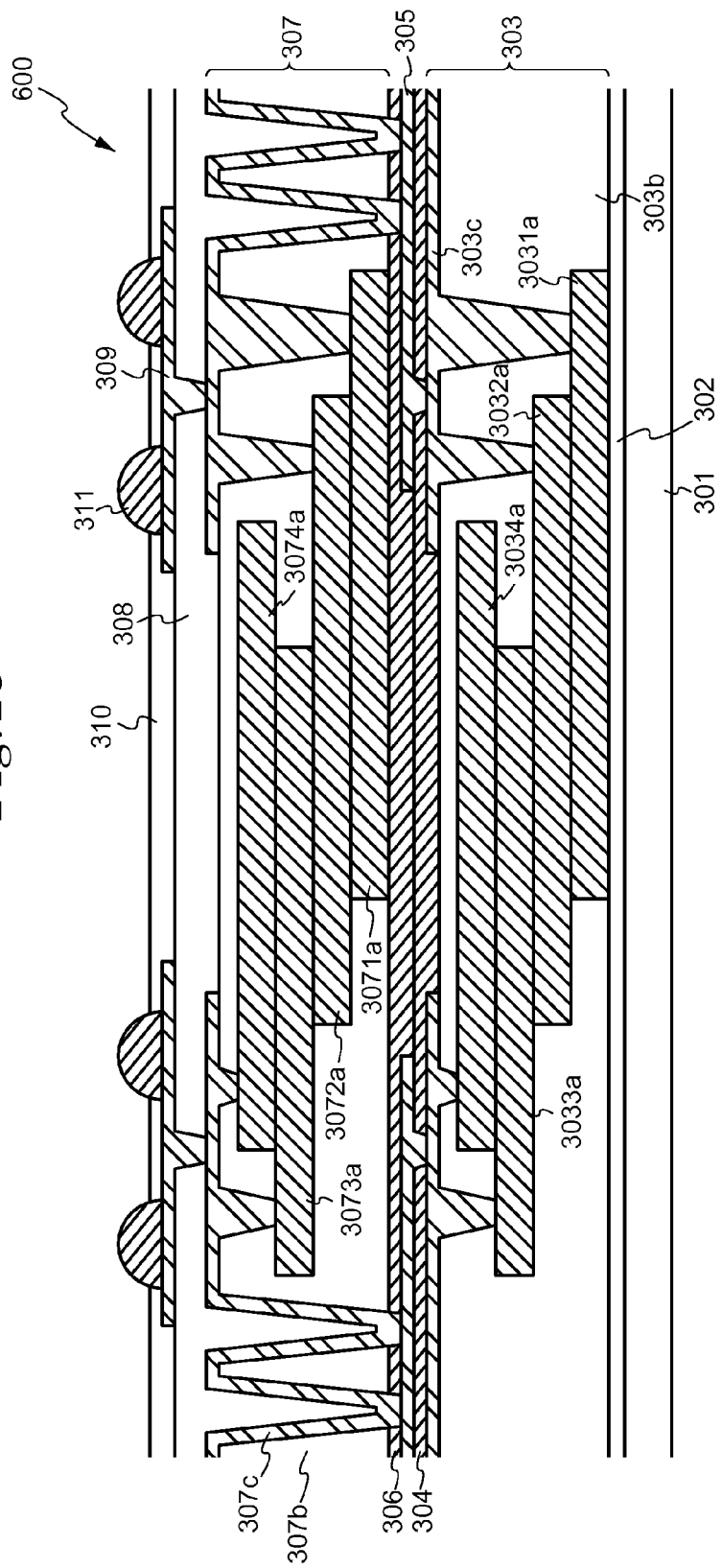
FIG. 13 is a cross-sectional view of a semiconductor package in embodiment 6 according to the present invention.

FIG. 13 is a cross-sectional view showing a part of a structure of a semiconductor package 600 in embodiment 6 according to the present invention. In the semiconductor package 600 in embodiment 6, a plurality of stack bodies, each including four semiconductor devices provided in a stacked manner, are stacked, and an intermediate buffer layer is provided for each of the stack bodies. Needless to say, the stack bodies may each include a larger number of semiconductor devices, for example, eight or 16 semiconductor devices, provided in a stacked manner, instead of four semiconductor devices. The details of the layers in this embodiment (e.g., the underlying buffer layer, the intermediate buffer layers and the encapsulation materials) are as described in embodiment 1, and such common structures will not be described.

As shown in FIG. 13, on a support substrate 301, an underlying buffer layer 302 is provided. On the underlying buffer layer 302, semiconductor devices 3031a, 3032a, 3033a and 3034a are stacked in a direction vertical to a main surface of the support substrate 301. In this embodiment, the underlying buffer layer 302 is provided in contact with the support substrate 301. Alternatively, the underlying buffer layer 302 may be omitted.

The semiconductor devices 3031a, 3032a, 3033a and 3034a are located such that parts thereof do not overlap each other as seen in a plan view (in the case where the semiconductor package is seen in the direction vertical to the main surface of the support substrate 301). In the case where the semiconductor devices are located to be offset in this manner, a terminal of each of the semiconductor devices is exposed. Thus, each of the semiconductor devices is electrically connectable with another element. With such a structure, in the case where the semiconductor devices adjacent to each other are of the same size, the semiconductor devices may be located to be offset. In the case where the semiconductor devices adjacent to each other are of different sizes, the smaller semiconductor device may be located above the larger semiconductor device such that a terminal of the larger semiconductor device is exposed.

The semiconductor devices 3031a, 3032a, 3033a and 3034a are respectively covered with an encapsulation material 303b. As can be seen, in the semiconductor package 600 in this embodiment, a stack body 303 includes the plurality of semiconductor devices 3031a, 3032a, 3033a and 3034a stacked in the direction vertical to the main surface of the support substrate 301, the encapsulation material 303b, and a line 303c.

Such a structure is produced as follows, for example. The plurality of semiconductor devices 3031a, 3032a, 3033a and 3034a are bonded together with a die attach (not shown) and stacked, and then are sealed with a sealing material at a reduced pressure to cover the entirety of the resultant structure with the encapsulation material 303b. As a result, no encapsulation material is provided between the semiconductor devices, which suppresses the thickness of the semiconductor package 600. As compared with a case where encapsulation materials are stacked to form one encapsulation material 303b, the internal stress is suppressed. This improves the reliability of the semiconductor package 600.

On the stack body 303, an intermediate buffer layer 304 is provided as a stress alleviation layer. In the semiconductor package 600 in this embodiment, an opening is formed in the intermediate buffer layer 304 by a known photolithography technology or a known laser processing technology. On the intermediate buffer layer 304, a line 305 is provided and connected with the line 303 via the opening. On the line 305, a second intermediate buffer layer 306 is provided as a stress alleviation layer.

It is preferable that the total thickness of the intermediate buffer layer 304 and the intermediate buffer layer 306 is ⅒ to ½ (more preferably, ¼ to ½) of the thickness of the encapsulation material 303b. In the case where an encapsulation material included in a stack body is thick as in this embodiment, the intermediate buffer layers may be stacked instead of increasing the thickness of one intermediate buffer layer in order to alleviate the stress.

In this embodiment, the line 305 is provided between the intermediate buffer layer 304 and the intermediate buffer layer 306. Alternatively, the line 305 may be omitted. Still alternatively, another semiconductor device or a passive element (resistor, coil, etc.) may be provided in an empty space of the layer including the line 305.

On the intermediate buffer layer 306, a stack body 307 including a plurality of semiconductor devices 3071a, 3072a, 3073a and 3074a, an encapsulation material 307b, and a line 307c is provided. In this embodiment also, the presence of the intermediate buffer layers 304 and 306 prevents the encapsulation material 303b and the encapsulation material 307b from contacting directly each other, and thus the internal stress caused at an interface between the encapsulation materials 303b and 307b is reduced.

The encapsulation material 307b has an opening. The line 307c provided on the encapsulation material 307b is connected with the line 305 via the opening. Thus, the semiconductor devices 3031a and 3032a and the semiconductor devices 3071a and 3072a are electrically connected with each other, and the semiconductor devices 3033a and 3034a and the semiconductor devices 3073a and 3074a are electrically connected with each other. Needless to say, the semiconductor package 600 is not limited to having such a structure, and there is no limitation on the combination of the semiconductor devices that are electrically connected with each other.

On the stack 307, an encapsulation material 308 and a line 309 are provided, and a solder resist 310 and external terminals 311 are provided thereon. In this embodiment, the line 309 is the uppermost line. Alternatively, more lines may be provided.

The semiconductor package 600 in embodiment 6 described above includes a plurality of stages of stack bodies (in this embodiment, four stages) including a plurality of semiconductor devices provided in a stacked manner in a direction vertical to the main surface of the support substrate, encapsulation materials each covering the plurality of semiconductor devices in each stack body, and lines respectively provided on the encapsulation materials and each connected with any of the plurality of semiconductor devices. An intermediate buffer layer is provided for each of the stack bodies and has a thickness in accordance with the thickness of the corresponding encapsulation material. Namely, an intermediate buffer layer is provided between the stack bodies.

The semiconductor package 600 in this embodiment described above has a smaller size and has a higher degree of integration in addition to the effect described in embodiment 1.

Embodiment 7

Figure 14:
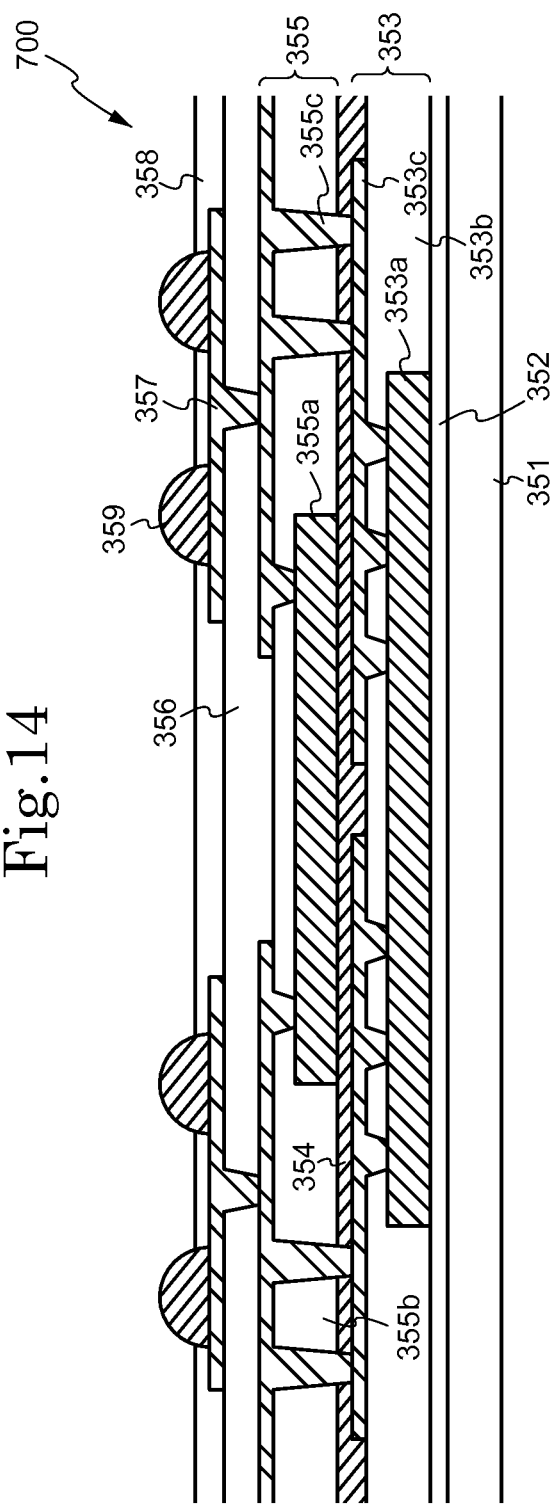
FIG. 14 is a cross-sectional view of a semiconductor package in embodiment 7 according to the present invention.

FIG. 14 is a cross-sectional view showing a part of a structure of a semiconductor package 700 in embodiment 7 according to the present invention. In the semiconductor package 700 in embodiment 7, stack bodies each including one semiconductor device are stacked with an intermediate buffer layer being provided between the stack bodies, and the semiconductor devices are electrically connected with each other. The details of the layers in this embodiment (e.g., the underlying buffer layer, the intermediate buffer layer and the encapsulation materials) are as described in embodiment 1, and such common structures will not be described.

As shown in FIG. 14, on a support substrate 351, an underlying buffer layer 352 is provided. On the underlying buffer layer 352, a stack body 353 including a semiconductor device 353a, an encapsulation material 353b and a line 353c is located. The line 353c is connected with the semiconductor device 353a via an opening provided in the encapsulation material 353b. In this embodiment, the underlying buffer layer 352 is provided in contact with the support substrate 351. Alternatively, the underlying buffer layer 352 may be omitted.

On the stack body 353, an intermediate buffer layer 354 is provided as a stress alleviation layer. On the intermediate buffer layer 354, a stack body 355 including a semiconductor device 355a, an encapsulation material 355b and a line 355c is located. The line 355c is connected with the semiconductor device 355a via an opening provided in the encapsulation material 355b and is also connected with the line 353c. As a result, the semiconductor device 353a and the semiconductor device 355a are electrically connected with each other via the line 353c and the line 355c.

In this embodiment also, the presence of the intermediate buffer layer 354 prevents the encapsulation material 353b and the encapsulation material 355b from contacting directly each other, and thus the internal stress caused at an interface between the encapsulation material 353b and the encapsulation material 355b is reduced.

On the line 355c, an encapsulation material 356 is provided. The encapsulation material 356 has an opening, and a line 357 provided on the encapsulation material 356 is connected with the line 355c via the opening.

On the line 357, a solder resist 358 and external terminals 359 are provided. In this embodiment, the line 357 is the uppermost line. Alternatively, more lines may be provided.

In the semiconductor package 700 in embodiment 7 described above, the stack body 355 is stacked on the intermediate buffer layer 354, and the semiconductor devices included in the stack bodies are electrically connected with each other. Therefore, the semiconductor package 700 has a higher degree of integration in addition to the effect described in embodiment 1.

Embodiment 8

FIG. 15 provides cross-sectional views respectively showing a part of structures of semiconductor packages 800 and 801. Basically, the semiconductor packages 800 and 801 in this embodiment each have the same structure as that of the semiconductor device 700 in embodiment 7. Herein, differences from the semiconductor device 700 will be mainly described. The same components as those of the semiconductor 700 will bear the same reference signs thereto.

Figure 15A:
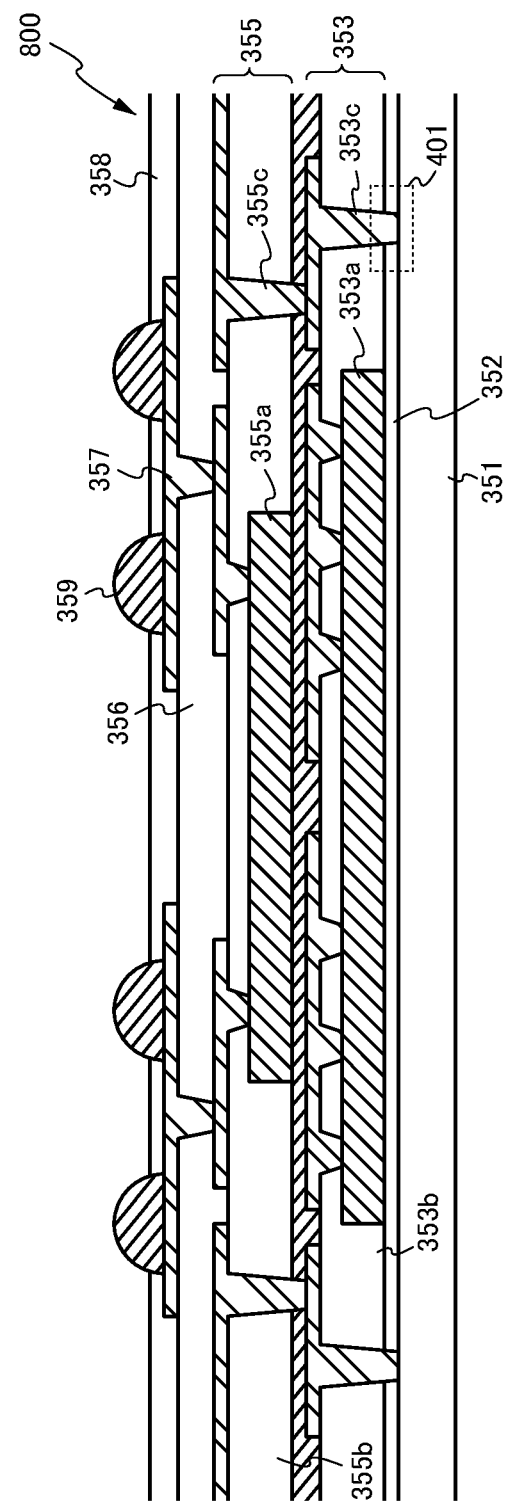
FIG. 15A shows cross-sectional views of semiconductor packages in embodiment 8 according to the present invention.

FIG. 15A is a cross-sectional view showing a part of the structure of the semiconductor package 800 in this embodiment. In the semiconductor package 800, the underlying buffer layer 352 and the encapsulation material 353b have an opening. As shown in a part enclosed by dashed square 401, the line 353c is connected with the support substrate 351. The line 355c is connected with the line 353c. This structure allows heat generated in the stack bodies 353 and 355 to escape to the support substrate 351. Namely, a part of the line 353c and the line 355c is used as a heat sink.

Figure 15B:
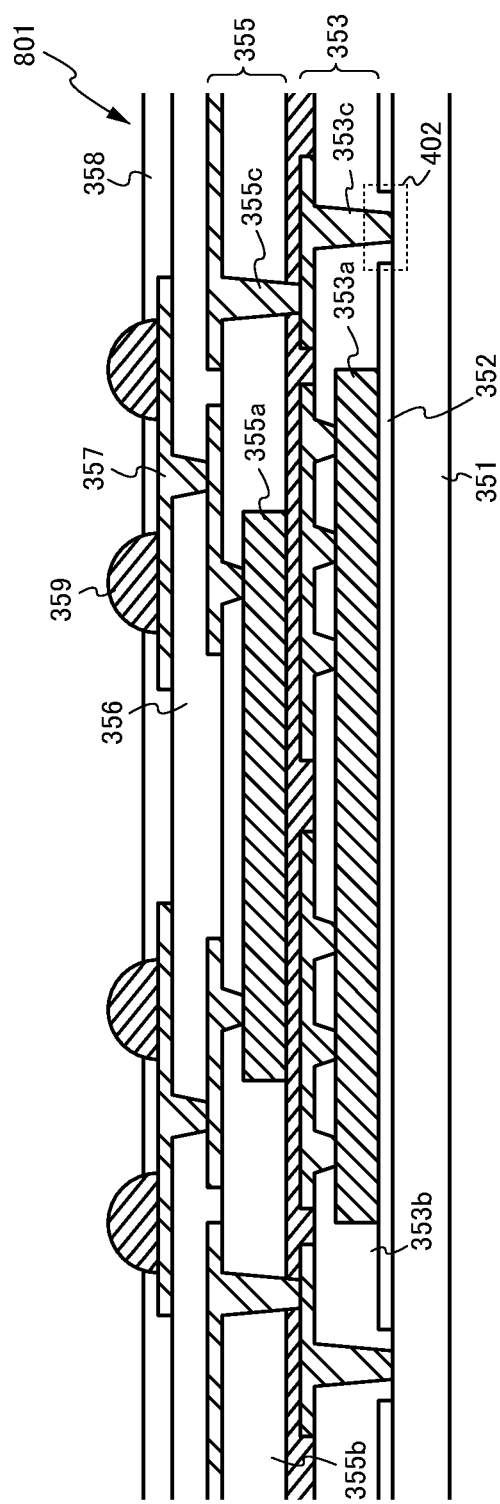
FIG. 15B shows cross-sectional views of semiconductor packages in embodiment 8 according to the present invention.

FIG. 15B is a cross-sectional view showing a part of the structure of the semiconductor package 801 in this embodiment. The semiconductor package 801 is improved from the semiconductor package 800. Specifically, as shown in a part enclosed by dashed square 402, an opening is formed in advance in a part of the underlying buffer layer 352 in which the line 353c and the support substrate 351 are to be connected with each other. Namely, the underlying buffer layer 352 has a first opening, and the encapsulation material 353b has a second opening inside the first opening. As can be seen, the second opening has a diameter shorter than that of the first opening. Therefore, the line 353c is connected with the support substrate 351 via the second opening provided in the encapsulation material 353c.

In the case of the semiconductor package 800 shown in FIG. 15A, the underlying buffer layer 352 and the encapsulation material 353b may have a large difference in the rate of processing performed to form the opening in the underlying buffer layer 352 and the encapsulation material 353b at the same time, depending on the materials used to form the underlying buffer layer 352 and the encapsulation material 353b. When this occurs, a good contact is not guaranteed between the line 353c and the support substrate 351.

By contrast, in the case of the semiconductor package 801 shown in FIG. 15B, the opening may be formed in the encapsulation material 353c in an area already deprived of the material of the underlying buffer layer 352. Therefore, there is no need to consider the processing rate difference described above. Therefore, the material of each of the underlying buffer layer 352 and the encapsulation material 353b may be selected from a wider range. This provides an advantage that the designing margin is improved.

As described above, the semiconductor packages 800 and 801 in embodiment 8, each of which uses a part of the lines as a heat sink connected with the support substrate. Therefore, the semiconductor packages 800 and 801 each have a higher reliability in addition to the effect described in embodiment 1. Especially, the semiconductor package 801 in embodiment 8 has an effect of improving the designing margin in the production process.

Embodiment 9

In this embodiment, the underlying buffer layers in embodiments 1 through 8 will be described in detail. The semiconductor package in each embodiment includes the underlying buffer layer as a stress alleviation layer on the main surface of the substrate, so that generation of a stress caused due to a difference in the property values (especially, the elastic modulus or coefficient of linear thermal expansion) between the support substrate and the encapsulation material is alleviated. Hereinafter, the properties of the underlying buffer layer will be described in detail.

The underlying buffer layer has a role of relaxing the internal stress caused due to a difference in property values between the support substrate and the encapsulation material (stress caused at an interface between the support substrate and the encapsulation material). Therefore, the underlying buffer layer is desirably formed of an insulating material having an elastic modulus lower than that of the support substrate and that of the encapsulation material.

Specifically, it is desirable that a combination of the materials of the support substrate, the underlying buffer layer and the encapsulation material is determined such that where the elastic modulus of the support substrate is A, the elastic modulus of the underlying buffer layer is B, and the elastic modulus of the encapsulation material is C in the same temperature condition, the relationship of A>C>B or C>A>B is obtained.

As can be seen, it is desirable that the underlying buffer layer has a low elastic modulus. For example, the elastic modulus of the underlying buffer layer is desirably 2 GPa or lower in the temperature range of about 25° C. (room temperature) and 100 MPa or lower in the temperature range exceeding 100° C. The upper limit is provided for the elastic modulus in each of the temperature ranges because when the elastic modulus exceeds the respective upper limit, the underlying buffer layer becomes too hard and the function thereof as a stress alleviation layer is deteriorated.

This will be described in more detail. At room temperature, the underlying buffer layer functions as a stress alleviation layer even if being hard to some extent (even if having a high elastic modulus to some extent). Therefore, the elastic modulus of the underlying buffer layer is set to 2 GPa at the highest. By contrast, in the temperature range exceeding 100° C. (desirably, in the temperature range exceeding 150° C.), for example, at a temperature at which a thermosetting resin is cured (around 170° C.) or in the vicinity thereof, the elastic modulus of the underlying buffer layer is set to 100 MPa or lower. A reason for this is that if the elastic modulus exceeds 100 MPa in such a high temperature range, the underlying buffer layer may not possibly function as a stress alleviation layer.

The underlying buffer layer has a higher functionality of relaxing the stress as having a lower elastic modulus. However, in the case where the elastic modulus is too low, the fluidity thereof becomes too high, and the underlying buffer layer may possibly not keep the shape thereof as a layer. Therefore, in this embodiment, the underlying buffer layer has an elastic modulus in such a range that keeps the shape thereof in a temperature range from room temperature to 260° C. (reflow temperature described later), although the lower limit is not specifically provided for the elastic modulus.

Now, it is assumed that an insulating layer that fulfills the above-described relationship of the elastic modulus is used as the underlying buffer layer. In this case, where the coefficient of linear thermal expansion of the support substrate is a, the coefficient of linear thermal expansion of the underlying buffer layer is b, and the coefficient of linear thermal expansion of the encapsulation material is c in the same temperature condition, the relationship of a≤c<b (or a≈c<b) is obtained.

In general, the coefficient of linear thermal expansion of a metal substrate is about 20 ppm/° C., and the coefficient of linear thermal expansion of an encapsulation material is several tens of ppm/° C. Therefore, in the semiconductor package in each embodiment, an insulating layer having a coefficient of linear thermal expansion of 100 to 200 ppm/° C., desirably 100 to 150 ppm/° C., in a temperature range of 200° C. or lower is used for the underlying buffer layer. The condition of the "temperature range of 200° C. or lower" is based on that the upper limit of the temperature in the production of a semiconductor package is about 200° C. A reason for providing such a condition is that it is desirable that the coefficient of linear thermal expansion of the underlying buffer layer is within the above-described range during the production of the semiconductor package.

It is desirable to use, for the underlying buffer layer, an adhesive material having a 5% weight reduction temperature of 300° C. or higher. This condition is provided for the following reason. A general reflow temperature is around 260° C. An insulating layer having a weight thereof not reduced much even after being subjected to a reflow process (namely, an insulating layer having a reflow resistance) is used, so that reduction of reliability of the semiconductor package is prevented.

The "weight reduction temperature" is one of indexes used to show the thermal resistance of a substance. A tiny amount of substance is gradually heated from room temperature while nitrogen gas or air is supplied, and the temperature at which the weight of the substance is reduced by a certain level is set as the "weight reduction temperature". In this example, the temperature at which the weight is reduced by 5% is used.

It is desirable to use, for the underlying buffer layer, a resin having an adhesive force classified to "class 0" in the cross-cut adhesion test of JIS (old JIS K5400) to both of the support substrate (substrate formed of a typical metal material such as an iron alloy, a copper alloy or the like) and the encapsulation material (e.g., epoxy-based, phenol-based, or polyimide-based resin). Use of such a resin increases the adhesiveness between the support substrate and the encapsulation material and thus suppresses the encapsulation material from being peeled off.

As described above, the underlying buffer layer in the semiconductor package in each embodiment described above is formed of an insulating layer fulfilling at least one of (desirably, both of) the conditions (1) and (2): (1) where the elastic modulus of the support substrate is A, the elastic modulus of the underlying buffer layer is B, and the elastic modulus of the encapsulation material is C in the same temperature condition, the relationship of A>C>B or C>A>B is obtained; and (2) where the coefficient of linear thermal expansion of the support substrate is a, the coefficient of linear thermal expansion of the underlying buffer layer is b, and the coefficient of linear thermal expansion of the encapsulation material is c in the same temperature condition, the relationship of a≤c<b (or a≈c<b) is obtained.

Use of such an insulating layer alleviates the internal stress caused due to a difference in the properties values between the support substrate and the encapsulation material and thus suppresses the warp of the support substrate or the encapsulation material to a minimum possible level. This improves the reliability of the semiconductor package.

Example 1

Support substrate: metal substrate (elastic modulus: 193 GPa at 25° C., 100° C.)
Underlying buffer layer: denatured epoxy-based resin (elastic modulus: 580 MPa at 25° C., 4 MPa at 100° C.)
Sealing member: epoxy-based resin (elastic modulus: 16 GPa at 25° C., 14.7 GPa at 100° C.)

Example 2

Support substrate: metal substrate (elastic modulus: 193 GPa at 25° C., 100° C.)
Underlying buffer layer: denatured epoxy-based resin (elastic modulus: 10 MPa at 25° C., 0.6 MPa at 100° C.)
Sealing member: epoxy-based resin (elastic modulus: 1.8 GPa at 25° C., 1 GPa at 100° C.)

As described above, the elastic modulus relationship among the support substrate, the underlying buffer layer and the encapsulation material is adjusted such that where the elastic modulus of the support substrate is A, the elastic modulus of the underlying buffer layer is B, and the elastic modulus of the encapsulation material is C in the same temperature condition, the relationship of A>C>B or C>A>B is obtained. Thus, a semiconductor package which alleviates the internal stress caused between the support substrate and the encapsulation material and provides a higher reliability is realized.

The invention claimed is:
1. A semiconductor package, comprising:
a metal substrate;
a first group of semiconductor devices provided in a stacked manner on the metal substrate in a direction vertical to a main surface of the metal substrate;
a first encapsulation material covering and being in contact with the first group of semiconductor devices;
a first line provided on the first encapsulation material, the first line extending from a surface of the first encapsulation material to a surface of the first group of semiconductor devices and being electrically connected with any of the first group of semiconductor devices via an opening in the first encapsulation material;
a first intermediate buffer layer covering the first line, the first intermediate buffer layer being formed of an insulating material different from an insulating material used to form the first encapsulation material;
a second line provided on the first intermediate buffer layer, the second line extending from a surface of the first intermediate buffer layer to a surface of the first line and being electrically connected with the first line via an opening in the first intermediate buffer layer;
a second intermediate buffer layer covering the second line, the second intermediate buffer layer being formed of an insulating material different from an insulating material used to form the first encapsulation material;
a second group of semiconductor devices provided in a stacked manner on the second intermediate buffer layer in the direction vertical to the main surface of the metal substrate; and
a second encapsulation material covering the second group of semiconductor devices provided on the second intermediate buffer layer, the second encapsulation material being formed of an insulating material different from the insulating material used to form the first intermediate buffer layer.
2. The semiconductor package according to claim 1, wherein the first group of semiconductor devices and the second group of semiconductor devices are located such that parts thereof do not overlap each other as seen in a plan view.

3. The semiconductor package according to claim 1, wherein the first encapsulation material and the second encapsulation material are formed of the same insulating material as each other.

4. The semiconductor package according to claim 1, wherein a total thickness of the first intermediate buffer layer and the second intermediate buffer layer has a thickness $\frac{1}{10}$ to $\frac{1}{2}$ of a thickness of the first encapsulation material.

5. The semiconductor package according to claim 1, further comprising an underlying buffer layer provided in contact with the metal substrate;
wherein the first encapsulation material is provided on the underlying buffer layer.

6. The semiconductor package according to claim 1, wherein the first intermediate buffer layer and the second intermediate buffer layer are formed of a material having an elastic modulus of 2 GPa or lower at room temperature and an elastic modulus of 1 GPa or lower at a temperature exceeding 100° C.

7. The semiconductor package according to claim 1, wherein the first intermediate buffer layer flattens a step caused by the first line.

8. The semiconductor package according to claim 1, wherein the first intermediate buffer layer and the second intermediate buffer layer contain a thermosetting resin material.

* * * * *